US012776756B2

(12) United States Patent
Mealy et al.

(10) Patent No.: US 12,776,756 B2
(45) Date of Patent: Oct. 27, 2026

(54) PHASE SHIFTER WITH PERIODIC CELLS

(71) Applicant: Apple Inc., Cupertino, CA (US)

(72) Inventors: Tarek Khedr Abdalla Mealy, San Diego, CA (US); Nitesh Singhal, Santa Clara, CA (US); Abbas Komijani, Mountain View, CA (US); Zhengan Yang, Del Mar, CA (US); Hideya Oshima, Santa Clara, CA (US); Xiaoqiang Li, San Diego, CA (US); Zhang Jin, San Diego, CA (US)

(73) Assignee: Apple Inc., Cupertino, CA (US)

( * ) Notice: Subject to any disclaimer, the term of this patent is extended or adjusted under 35 U.S.C. 154(b) by 333 days.

(21) Appl. No.: 18/478,118

(22) Filed: Sep. 29, 2023

(65) Prior Publication Data

US 2025/0112610 A1 Apr. 3, 2025

(51) Int. Cl.
*H01Q 1/50* (2006.01)
*H03H 7/18* (2006.01)

(52) U.S. Cl.
CPC ................ *H03H 7/18* (2013.01); *H01Q 1/50* (2013.01)

(58) Field of Classification Search
CPC .......... H03H 7/01; H03H 7/0115; H03H 7/09; H03H 7/1766; H03H 7/18; H03H 7/20; H01Q 1/50
See application file for complete search history.

(56) References Cited

U.S. PATENT DOCUMENTS 6,137,377 A 10/2000 Wallace et al.
7,126,442 B2 * 10/2006 Nakajima ................ H03H 7/20 333/156
9,450,557 B2 * 9/2016 Reiha ...................... H03H 7/185
10,957,975 B2 3/2021 Meyer et al.
2018/0212590 A1 * 7/2018 Shrivastava ............. H03H 7/20
2021/0151878 A1 5/2021 Abbasi et al.
2023/0048770 A1 * 2/2023 Brown, Jr. ............... H03H 7/20
2023/0216215 A1 7/2023 Corman et al.
2023/0246708 A1 8/2023 Adams et al.
2024/0118382 A1 * 4/2024 Liu ...................... H01Q 3/2605

FOREIGN PATENT DOCUMENTS

WO WO-2023135663 A1 * 7/2023 ............... H03H 7/20

OTHER PUBLICATIONS

"Phase-Shift Circuit", WO 2023135663 A1, Saiki et al., Jul. 20, 2023 (English Text). (Year: 2023).*

* cited by examiner

*Primary Examiner* — Quochien B Vuong
(74) *Attorney, Agent, or Firm* — FLETCHER YODER PC

(57) ABSTRACT

A phase shifter circuit may include a multiple phase shifter cells (or cells) to selectively shift a phase of an input signal by a desired phase shift value. For example, each of the phase shifter cells may shift the phase of the input signal by a positive fractional phase shift value or a negative fractional phase shift value. The phase shifter cells may include circuitry to form an inductor-capacitor circuit to provide the negative fractional phase shift value and form a capacitor-inductor circuit to provide the positive fractional phase shift value. The phase shifter cells may receive control signals to form the inductor-capacitor circuit and the capacitor-inductor circuit. An electronic device may include multiple phase shifter circuits to adjust a phase of transmission signals and/or reception signals of phased array antennas.

20 Claims, 15 Drawing Sheets

PHASE SHIFTER WITH PERIODIC CELLS

BACKGROUND

The present disclosure relates generally to wireless communication, and more specifically to voltage-controlled oscillators of transmitter and/or receiver circuits.

In some applications, an electronic device may include circuitry for transmitting and receiving signals. The electronic device may include multiple antennas transmitting a signal in a signal direction. Alternatively or additionally, the electronic device may include multiple antennas for receiving a signal from the signal direction. The electronic device may adjust a phase of transmission signals or reception signals of each of the multiple antennas in relation to the signal direction. Improved phase shifter circuits to improve phase adjustments and signal transmission directivity and/or signal reception is desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a phase shifter circuit includes a first cell including a first inductor, a first capacitor, a second inductor, and a second capacitor. The phase shifter circuit also includes a second cell coupled to the first cell. The second cell includes a third inductor, a third capacitor, a fourth inductor, and a fourth capacitor.

In another embodiment, an electronic device includes a first antenna, a second antenna, and a phase shifter circuit coupled to the first antenna. The first phase shifter circuit includes a first cell and a second cell. The first phase shifter circuit is configured to output a first signal with a first phase shift value based on a first fractional phase shift value of the first cell and a second fractional phase shift value of the second cell. The electronic device also includes a second phase shifter circuit coupled to the second antenna. The second phase shifter circuit includes a third cell and a fourth cell. The second phase shifter circuit is configured to output a second signal with a second phase shift value based on a third fractional phase shift value of the third cell and a fourth fractional phase shift value of the fourth cell.

In yet another embodiment, a transceiver includes a first phase shifter circuit including a first cell coupled to a second cell. The first cell is configured to shift a phase of a signal by a first phase shift value and a second phase shift value. The second cell is configured to shift the phase of the signal by the first phase shift value and the second phase shift value. The transceiver also includes a second phase shifter circuit including a third cell coupled to a fourth cell. The third cell is configured to shift the phase of the signal by the first phase shift value and the second phase shift value. The fourth cell is configured to shift the phase of the signal by the first phase shift value and the second phase shift value.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
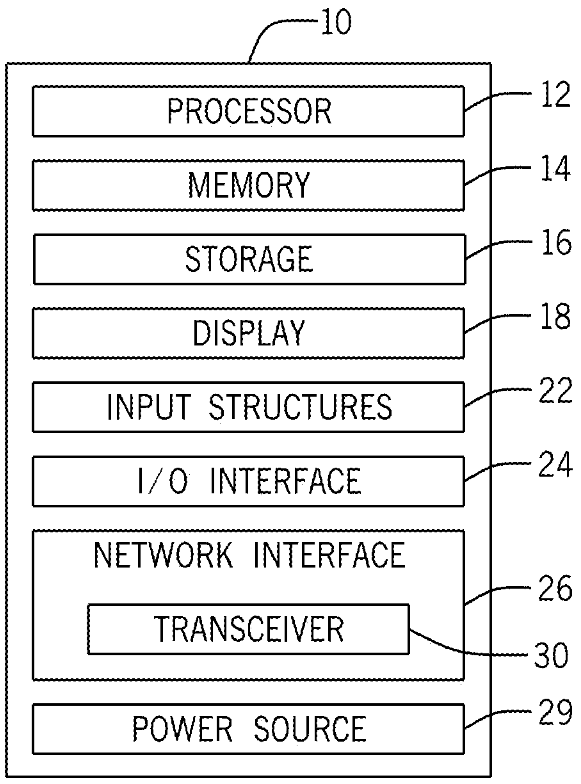
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a phase shifter circuit with multiple cascaded phase shifter cells. An electronic device may include phased array antennas, multiple transmitter branches, and/or multiple receiver branches. The phased array antennas may include multiple antennas. Each transmitter branch may be coupled to a respective antenna of the phased array antennas. Moreover, each receiver branch may be coupled to a respective antenna of the phased array antennas. A transmitter branch, a receiver branch, or both may include a phase shifter circuit including multiple cascaded phase shifter cells.

The electronic device may transmit a transmission signal with a desired beam. The transmitter branches may each receive an in-phase signal for transmission corresponding to the transmission signal. One or more of the transmitter branches may adjust the phase of the respective signals based on the desired beam. In particular, the phase shifter circuits of the transmitter branches may adjust the phase of the signals such that the phased array antennas may transmit the signals to constructively combine in a direction of the beam and destructively combine in other directions.

Phase shifter circuits of each transmitter branch may adjust a phase of the respective signal based on the direction of the beam. For example, one or more phase shifter circuits of one or more transmitter branches may adjust the phase of the respective signals by different phase shift values compared to one or more other transmitter branches to form the desired beam. As such, one or more of the transmitter branches may output the respective signals out-of-phase compared to one or more other transmitter branches. Accordingly, the phased array antennas may transmit the signals to constructively combine in the direction of the beam to generate the transmission signal with the desired beam and destructively combine in other directions.

The electronic device may receive a reception signal from a desired beam. The receiver branches may each receive a signal corresponding to the reception signal. Moreover, one or more of the receiver branches may receive the respective signals out-of-phase compared to one or more other receiver branches based on a direction of the beam. As such, the receiver branches may each adjust the phase of the respective signals by a respective phase shift value to output in-phase signals. In particular, the phase shifter circuits of the receiver branches may adjust the phase of the signals for constructively combining the signals. For example, one or more phase shifter circuits of one or more receiver branches may adjust the phase of the respective signals by different phase shift values compared to one or more other receiver branches. Accordingly, a processor and/or controller may receive the in-phase signals or a combined signal based on combining the in-phase signals.

With the foregoing in mind, a phase shifter circuit of a transmitter branch and/or a receiver branch may include multiple cascaded phase shifter cells to adjust a phase of an input signal by a phase shift value. Each phase shifter cell may shift the phase of a signal by a fraction of (e.g., $\frac{1}{100}^{th}$ of, $\frac{1}{55}^{th}$ of $\frac{1}{8}^{th}$ of, a quarter of, half of, among other possibilities) the phase shift value of the phase shifter circuit. For example, the phase shifter cells may be programmable to shift the phase of the signal by a positive fractional phase shift value or a negative fractional phase shift value based on receiving a control signal from a processor.

A combination of the positive fractional phase shift values and negative fractional phase shift values of each of the cascaded phase shifter cells may correspond to the phase shift value of the phase shifter circuit. A fractional phase shift value of each phase shifter cell of the cascaded phase shifter cells may cumulatively combine to output the signal with adjusted phase based on the phase shift value. Moreover, in some cases, insertion loss, phase errors, and/or amplitude errors of two or more of the cascaded phase shifter cells may at least partially and destructively combine. Accordingly, the phase shifter circuit may output the signal with the phase shift value with reduced insertion loss, reduced phase error, and/or reduced amplitude error compared to other phase shifter circuits.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3$^{rd}$ generation (3G) cellular network, universal mobile telecommunication system (UMTS), 4$^{th}$ generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
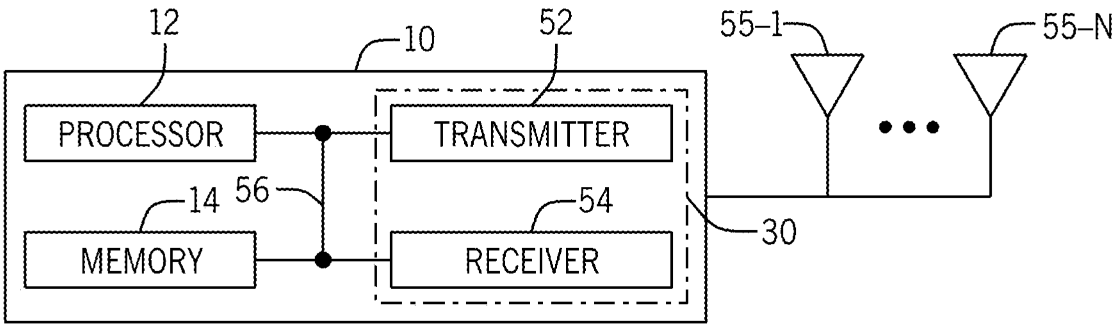
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55-1, 55-2, 55-3, and 55-N (e.g., phased array antennas 55-1-55-N) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have the antennas 55-1, 55-2, 55-3, and 55-N electrically coupled to the transceiver 30. The antennas 55-1, 55-2, 55-3, and 55-N may be configured in an omni-directional or directional configuration, in a single-beam, dual-beam, or multi-beam arrangement, and so on. Each antenna 55 may be associated with one or more beams and various configurations. In some embodiments, multiple antennas of the antennas 55-1, 55-2, 55-3, and 55-N of an antenna group or module may be communicatively coupled to a respective transceiver 30 and each emit radio frequency signals that may constructively and/or destructively combine to form a beam. The electronic device 10 may include multiple transmitter branches, multiple receiver branches, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
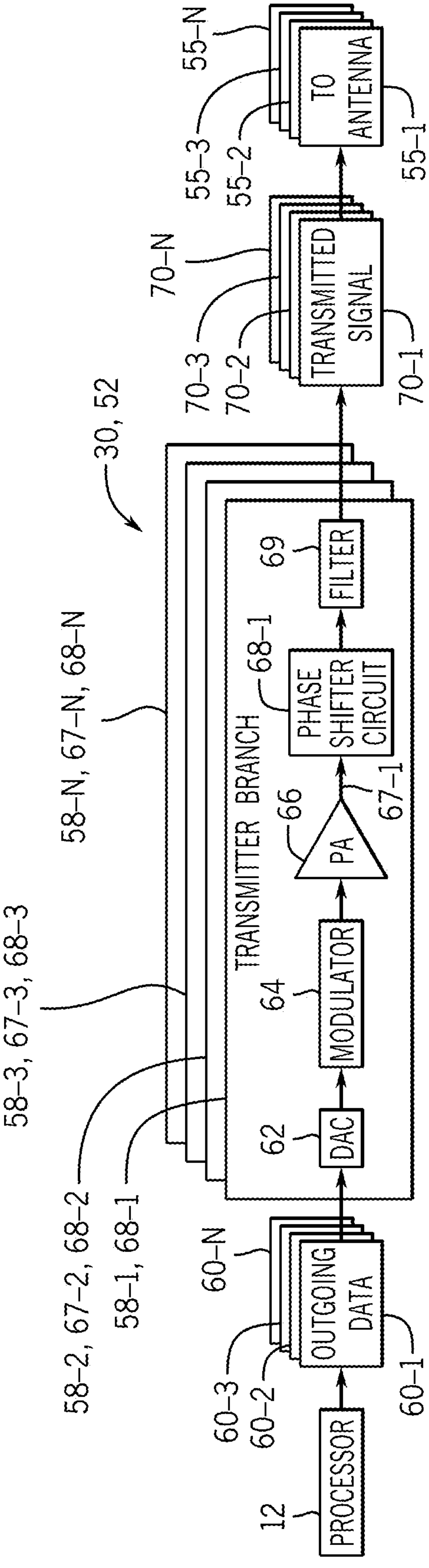
FIG. 3 is a schematic diagram of a transmitter of the electronic device of FIG. 1 including phase shifter circuits, according to embodiments of the present disclosure.

FIG. 3 is a schematic diagram of the transmitter 52 (e.g., transmit circuitry) including a first transmitter branch 58-1, a second transmitter branch 58-2, a third transmitter branch 58-3, and a fourth transmitter branch 58-N, according to embodiments of the present disclosure. In different embodiments, the transmitter 52 may include a different number of transmitter branches 58. As illustrated, the transmitter 52 may receive outgoing data 60-1, 60-2, 60-3, and 60-N in the form of a digital signal to be transmitted via the antennas 55-1, 55-2, 55-3, and 55-N. For example, the first transmitter branch 58-1 may receive first outgoing data 60-1, the second transmitter branch 58-2 may receive second outgoing data 60-2, the third transmitter branch 58-3 may receive third outgoing data 60-3, and the fourth transmitter branch 58-N may receive fourth outgoing data 60-N. In the depicted embodiment, the processor 12 may generate and/or output the outgoing data 60-1, 60-2, 60-3, and 60-N. It should be appreciated that any other viable component may generate and/or provide the outgoing data 60-1, 60-2, 60-3, and 60-N to the transmitter 52.

The transmitter branches 58-1, 58-2, 58-3, and 58-N may each output a respective transmitted signal 70-1, 70-2, 70-3, and 70-N based on receiving the outgoing data 60-1, 60-2, 60-3, and 60-N to the antennas 55-1, 55-2, 55-3, and 55-N. The first transmitter branch 58-1 is described below. It should be appreciated that in some embodiments, the transmitter branches 58-2, 58-3, and/or 58-N may include similar circuitry. Alternatively or additionally, the transmitter branches 58-2, 58-3, and/or 58-N may include different circuitry.

In any case, a digital-to-analog converter (DAC) 62 of the first transmitter branch 58-1 may convert the digital signal to an analog signal, and a modulator 64 may combine the converted analog signal with a carrier signal to generate a radio wave. A power amplifier (PA) 66 receives the modulated signal from the modulator 64. The power amplifier 66 may generate a first amplified signal 67-1 by amplifying the modulated signal to a suitable level for driving transmission of the signal via a first antennas 55-1 of the antennas 55-1, 55-2, 55-3, and 55-N.

A first phase shifter circuit 68-1 may adjust a phase of the first amplified signal 67-1 based on a desired beam for signal transmission (e.g., a signal transmission beam). It should be appreciated that in different cases, the first phase shifter circuit 68-1 may adjust the phase of the first amplified signal 67-1 by a different phase shift value. For example, the processor 12 of the electronic device 10 discussed above may generate control signals to adjust the phase shift value of the first phase shifter circuit 68-1 based on the desired beam. Moreover, the transmitter branches 58-2, 58-3, and/or 58-N may each include respective phase shifter circuits 68-2, 68-3, and 68-N to adjust a phase of respective amplified signals 67-2, 67-3, and 67-N (discussed below) based on the desired beam, as will be appreciated. In different cases, each of the phase shifter circuits 68-1, 68-2, 68-3, and 68-N may adjust a phase of the respective amplified signals 67-2, 67-3, and 67-N by a similar phase shift value or different phase shift values based a direction for forming the desired beam associated with the respective antennas 55-1, 55-2, 55-3, and 55-N. Although in the depicted embodiment an input of the first phase shifter circuit 68-1 may be coupled to an output of the first amplified signal 67-1, it should be appreciated that in alternative or additional embodiments, an output of the first phase shifter circuit 68-1 may be coupled to an input of the first amplified signal 67-1.

In the depicted embodiment, a filter 69 (e.g., filter circuitry and/or software) of the transmitter 52 may then remove undesirable noise from the first amplified signal 67-1 (e.g., the phase-shifted first amplified signal 67-1) to generate a first transmitted signal 70-1 for transmission by the first antenna 55-1. The filter 69 may include any suitable filter or filters to remove the undesirable noise from the first amplified signal 67-1, such as a bandpass filter, a bandstop filter, a low pass filter, a high pass filter, and/or a decimation filter. As mentioned above, the transmitter branches 58-1, 58-2, 58-3, and 58-N may each output the respective transmitted signal 70-1, 70-2, 70-3, and 70-N. For example, each transmitter branch 58-1, 58-2, 58-3, and 58-N may output the respective transmitted signal 70-1, 70-2, 70-3, or 70-N to a respective antenna 55-1, 55-2, 55-3, or 55-N for transmission.

The power amplifier 66, the first phase shifter circuit 68-1, and/or the filter 69 may be referred to as part of a radio frequency front end (RFFE), and more specifically, a transmit front end (TXFE) of the electronic device 10. Moreover, in additional or alternative embodiments, the transmitter 52 may include the DAC 62, the modulator 64, the power amplifier 66, the first phase shifter circuit 68-1, and the filter 69 in any other viable order. Additionally, the transmitter 52 may include any suitable additional components not shown, or may not include certain of the illustrated components, such that the transmitter 52 may transmit the outgoing data 60 via the antennas 55-1, 55-2, 55-3, and/or 55-N. For example, the transmitter 52 may include a mixer and/or a digital up converter. As another example, the transmitter 52 may not include the filter 69 if the power amplifier 66 outputs the first amplified signal 67-1 in or approximately in a desired frequency range (such that filtering of the first amplified signal 67-1 may be unnecessary).

Figure 4:
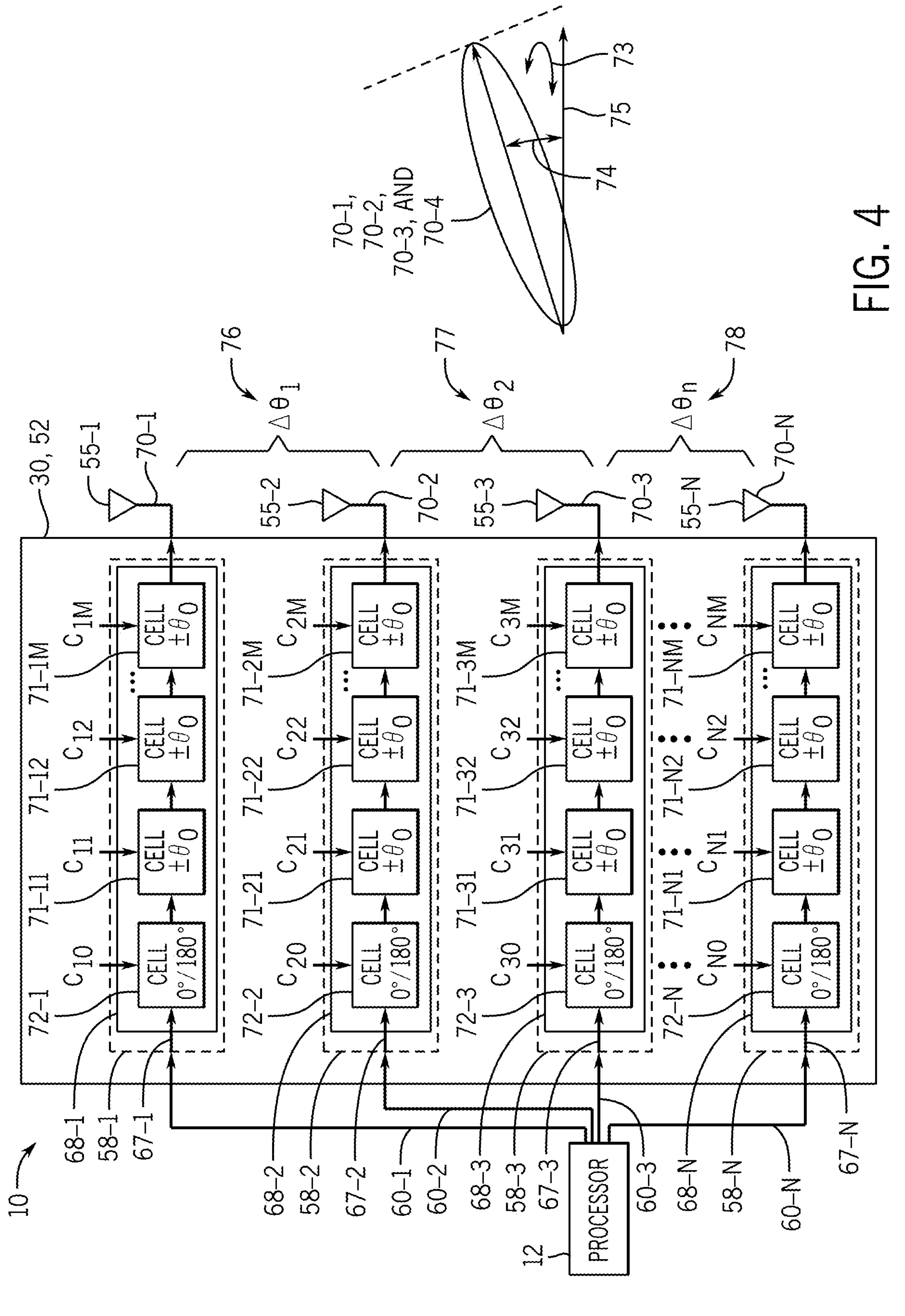
FIG. 4 is a schematic diagram of the phase shifter circuits of transmitter branches of the transmitter of FIG. 3 including cascaded phase shifter cells, according to embodiments of the present disclosure.

FIG. 4 is a schematic diagram of the phase shifter circuits 68-1, 68-2, 68-3, and 68-N of the transmitter branches 58-1, 58-2, 58-3, and 58-N including cascaded phase shifter cells 71, according to embodiments of the present disclosure. The transmitter 52 may include the transmitter branches 58-1, 58-2, 58-3, and 58-N each including the respective phase shifter circuit 68-1, 68-2, 68-3, or 68-N. In particular, the first transmitter branch 58-1 may include the first phase shifter circuit 68-1, the second transmitter branch 58-2 may include a second phase shifter circuit 68-2, the third transmitter branch 58-3 may include a third phase shifter circuit 68-3, and the fourth transmitter branch 58-N may include a fourth phase shifter circuit 68-N.

Although four transmitter branches 58-1, 58-2, 58-3, and 58-N are depicted and described herein, it should be appreciated that the transmitter 52 may include any viable number of transmitter branches 58 (e.g., two, three, five, twenty one, among other possibilities). Similarly, although four phase shifter circuits 68-1, 68-2, 68-3, and 68-N are depicted and described herein, it should be appreciated that the transmitter 52 may include any viable number of the phase shifter circuits 68 (e.g., two, three, five, nine, among other possibilities). Moreover, in the depicted embodiment, the phase shifter circuits 68-1, 68-2, 68-3, and 68-N may each include a respective inverter block 72. It should be appreciated that in alternative or additional embodiments, one or more of the phase shifter circuits 68-1, 68-2, 68-3, and 68-N may omit or bypass the respective inverter block 72. Furthermore, it should be appreciated that FIG. 4 depicts a portion of the electronic device 10 for illustration and simplicity. For example, the processor 12 may be coupled to the phase shifter circuits 68-1, 68-2, 68-3, and 68-N via the DAC 62, the modulator 64, the power amplifier 66, and/or the filter 69, among other things. Similarly, in different embodiments, the phase shifter circuits 68-1, 68-2, 68-3, and 68-N may be coupled to the antennas 55-1, 55-2, 55-3, and 55-N via the filter 69, the power amplifier 66, the modulator 64, and/or the DAC 62, among other things.

The first phase shifter circuit 68-1 may include a first inverter block 72-1, a first phase shifter cell 71-11, a second phase shifter cell 71-12, and a third phase shifter cell 71-1M. The second phase shifter circuit 68-2 may include a second inverter block 72-2, a first phase shifter cell 71-21, a second phase shifter cell 71-22, and a third phase shifter cell 71-2M. The third phase shifter circuit 68-3 may include a third inverter block 72-3, a first phase shifter cell 71-31, a second phase shifter cell 71-32, and a third phase shifter cell 71-3M. Moreover, the fourth phase shifter circuit 68-N may include a fourth inverter block 72-N, a first phase shifter cell 71-N1, a second phase shifter cell 71-N2, and a third phase shifter cell 71-NM. Although in the depicted embodiment each of the phase shifter circuits 68-1, 68-2, 68-3, and 68-N include three phase shifter cells 71, it should be appreciated that each of the phase shifter circuits 68-1, 68-2, 68-3, and 68-N of the transmitter 52 may include any other viable number of phase shifter cells (e.g., two, three, seven, M, among other possibilities).

As mentioned above, the processor 12 may generate the outgoing data 60-1, 60-2, 60-3, 60-3, and 60-N. The first transmitter branch 58-1 may receive the first outgoing data 60-1, the second transmitter branch 58-2 may receive the second outgoing data 60-2, the third transmitter branch 58-3 may receive the third outgoing data 60-3, the fourth transmitter branch 58-N may receive the fourth outgoing data 60-N. As described above, the DAC 62, the modulator 64, and/or the PA 66, among other things, of the first transmitter branch 58-1 may generate the first amplified signal 67-1. The transmitter branches 58-2, 58-3, and 58-N may generate the amplified signals 67-2, 67-3, and 67-N. As such, the first phase shifter circuit 68-1 may receive the first amplified signal 67-1, the second phase shifter circuit 68-2 may receive a second amplified signal 67-2, the third phase shifter circuit 68-3 may receive a third amplified signal 67-3, and the fourth phase shifter circuit 68-N may receive a fourth amplified signal 67-N.

The processor 12 may generate and output each of the outgoing data 60-1, 60-2, 60-3, 60-3, and 60-N for transmission by the respective antennas 55-1, 55-2, 55-3, and 55-N with a respective direction associated with the desired beam. The desired beam may correspond to a directed stream of the transmitted signals 70-1, 70-2, 70-3, and 70-N with an azimuth angle 73 and an elevation angle 74 with respect to a reference direction 75, and orthogonal to a respective wave front line. For example, the reference direction 75 may be associated with a perpendicular plain of the antennas 55-1, 55-2, 55-3, and/or 55-N having zero or near zero degrees as a reference point for the azimuth angle 73 and the elevation angle 74. The transmitter 52 may adjust the phase of each of the amplified signals 67-1, 67-2, 67-3, and 67-N (or the outgoing data 60-1, 60-2, 60-3, and 60-N) such that the transmitted signals 70-1, 70-2, 70-3, and 70-N may constructively combine in the direction of the azimuth angle 73 and the elevation angle 74 of the desired beam.

Each of the phase shifter circuits 68-1, 68-2, 68-3, and/or 68-N may adjust a phase of the respective amplified signals 67-1, 67-2, 67-3, and/or 67-N by a respective phase shift value (e.g., −100°, −54°, −23°, −5°, 0°, 3°, 24°, 45°, among other possibilities). The phase shift values may correspond to a direction for generating the desired beam. For example, one or more of the phase shifter circuits 68-1, 68-2, 68-3, and/or 68-N may adjust the phase of the respective amplified signals 67-1, 67-2, 67-3, and/or 67-N by different phase shift values compared to one or more other phase shifter circuits 68-1, 68-2, 68-3, and/or 68-N to form the desired beam. As such, in some embodiments, the antennas 55-1, 55-2, 55-3, and 55-N may output the respective transmitted signals 70-1, 70-2, 70-3, and 70-N out-of-phase compared to one or more other antennas 55-1, 55-2, 55-3, and 55-N.

In the depicted embodiment, the first antenna 55-1 may transmit the transmitted signal 70-1 with a first phase difference (e.g., $\Delta\ \theta_1$, first differential transmission phase) 76 compared to the second antenna 55-2 transmitting the transmitted signal 70-2. Moreover, the second antenna 55-2 may transmit the transmitted signal 70-2 with a second phase difference (e.g., $\Delta\ \theta_2$, second differential transmission phase) 77 compared to the third antenna 55-3 transmitting the transmitted signal 70-3. Furthermore, the third antenna 55-3 may transmit the transmitted signal 70-3 with a third phase difference (e.g., $\Delta\ \theta_3$, third differential transmission phase) 78 compared to the fourth antenna 55-N transmitting the transmitted signal 70-N.

With the foregoing in mind, each of the inverter blocks 72 and the phase shifter cells 71 of the phase shifter circuits 68-1, 68-2, 68-3, and/or 68-N may be programmable. Each of the inverter blocks 72 and the phase shifter cells 71 may shift the phase of the signal based on receiving a respective control signal. In some cases, the processor 12 may generate the outgoing data 60-1, 60-2, 60-3, 60-3, and/or 60-N to include the control signals.

The processor 12 may generate a first set of control signals ($C_{10}$, $C_{11}$, $C_{12}$, and $C_{1M}$) for the first inverter block 72-1 and the phase shifter cells 71-1 of the first phase shifter circuit 68-1. The processor 12 may generate a second set of control signals ($C_{20}$, $C_{21}$, $C_{22}$, and $C_{2M}$) for the second inverter block 72-2 and the phase shifter cells 71-2 of the second phase shifter circuit 68-2. Moreover, the processor 12 may generate a third set of control signals ($C_{30}$, $C_{31}$, $C_{32}$, and $C_{3M}$) for the third inverter block 72-3 and the phase shifter cells 71-3 of the third phase shifter circuit 68-3. Furthermore, the processor 12 may generate a fourth set of control signals ($C_{N0}$, $C_{N1}$, $C_{N2}$, and $C_{NM}$) for the fourth inverter block 72-N and the phase shifter cells 71-N of the fourth phase shifter circuit 68-N. In some embodiments, the first outgoing data 60-1 may include the first set of control signals, the second outgoing data 60-2 may include the second set of control signals, the third outgoing data 60-3 may include the third set of control signals, and/or the fourth outgoing data 60-N may include the fourth set of control signals.

The first phase shifter circuit 68-1 may adjust a phase of the first amplified signal 67-1 by a first phase shift value. The first inverter block 72-1 may shift the phase of the first amplified signal 67-1 by 0° or 180° (e.g., π) phase based on a control signal (e.g., $C_{10}$). The phase shifter cells 71-1 may each shift the phase of the first amplified signal 67-1 by a positive fractional phase shift value ($+\theta_0$) or a negative fractional phase shift value ($-\theta_0$) based on a respective control signal (e.g., $C_{11}$, $C_{12}$, or $C_1$M). In some cases, the positive fractional phase shift value and the negative fractional phase shift value may have an equal or nearly equal absolute value.

As illustrated, the first inverter block 72-1 and the phase shifter cells 71-1 may be coupled to each other in a cascaded form. As such, the phase shift values of the first inverter block 72-1 and each of the cascaded phase shifter cells 71-1 may cumulatively combine. Moreover, a combination of the phase shift values of the first inverter block 72-1 and each of the cascaded phase shifter cells 71-1 may correspond to the first phase shift value of the first phase shifter circuit 68-1. Accordingly, the first transmitter branch 58-1 and/or the first phase shifter circuit 68-1 may output the first transmitted signal 70-1 with an adjusted phase based on the first phase shift value.

Similarly, the second phase shifter circuit 68-2 may adjust a phase of the second amplified signal 67-2 by a second phase shift value, the third phase shifter circuit 68-3 may adjust a phase of the third amplified signal 67-3 by a third phase shift value, and the fourth phase shifter circuit 68-N may adjust a phase of the fourth amplified signal 67-N by a fourth phase shift value. The inverter blocks 72-2, 72-3, and 72-N may shift the phase of the respective amplified signals 67-2, 67-3, or 67-N by 0° or 180° (e.g., π) phase based on a respective control signal (e.g., $C_{20}$, $C_{30}$, and $C_{N0}$). The phase shifter cells 71-2, 71-3, and 71-N may each shift the phase of the respective amplified signals 67-2, 67-3, or 67-N by the positive fractional phase shift value ($+\theta_0$) or the negative fractional phase shift value ($-\theta_0$) based on a respective control signal (e.g., $C_{21}$, $C_{22}$, $C_{2M}$, $C_{31}$, $C_{32}$, $C_{3M}$, $C_{N1}$, $C_{N2}$, and $C_{NM}$).

The phase shift values of the second inverter block 72-2 and each of the cascaded phase shifter cells 71-2 may cumulatively combine. A combination of the phase shift values of each of the second inverter block 72-2 and the cascaded phase shifter cells 71-2 may correspond to the second phase shift value of the second phase shifter circuit 68-2. Accordingly, the second transmitter branch 58-2 and/or the second phase shifter circuit 68-2 may output the second transmitted signal 70-2 with an adjusted phase based on the second phase shift value.

The phase shift values of the third inverter block 72-3 and each of the cascaded phase shifter cells 71-3 may cumulatively combine. A combination of the phase shift values of each of the third inverter block 72-3 and the cascaded phase shifter cells 71-3 may correspond to the third phase shift value of the third phase shifter circuit 68-3. Accordingly, the third transmitter branch 58-3 and/or the third phase shifter circuit 68-3 may output the third transmitted signal 70-3 with an adjusted phase based on the third phase shift value.

The phase shift values of the fourth inverter block 72-N and each of the cascaded phase shifter cells 71-N may cumulatively combine. A combination of the phase shift values of each of the fourth inverter block 72-N and the cascaded phase shifter cells 71-N may correspond to the fourth phase shift value of the fourth phase shifter circuit 68-N. Accordingly, the fourth transmitter branch 58-N and/or the fourth phase shifter circuit 68-N may output the fourth transmitted signal 70-N with an adjusted phase based on the fourth phase shift value.

As such, the phase shifter circuits 68-1, 68-2, 68-3, and/or 68-N may each adjust a phase of the respective amplified signals 67-1, 67-2, 67-3, and/or 67-N based on the direction of the beam. The antennas 55-1, 55-2, 55-3, and 55-N may output the transmitted signals 70-1, 70-2, 70-3, and 70-N to constructively combine in the direction of the beam and destructively combine in other directions. Accordingly, the transmitter 52 may form the desired beam based on adjusting respective phases of the transmitted signals 70-1, 70-2, 70-3, and 70-N. In some cases, the phase shifter cells 71 may each have a smaller insertion loss, phase error, and/or amplitude error compared to that of other phase shifter circuits. Moreover, in some cases, insertion loss, phase errors, and/or amplitude errors of two or more of the cascaded phase shifter cells 71 may at least partially and destructively combine. Accordingly, the phase shifter circuits 68 may each output the signal with a desired phase shift with reduced insertion loss, reduced phase error, and/or reduced amplitude error compared to other phase shifter circuits.

Figure 5:
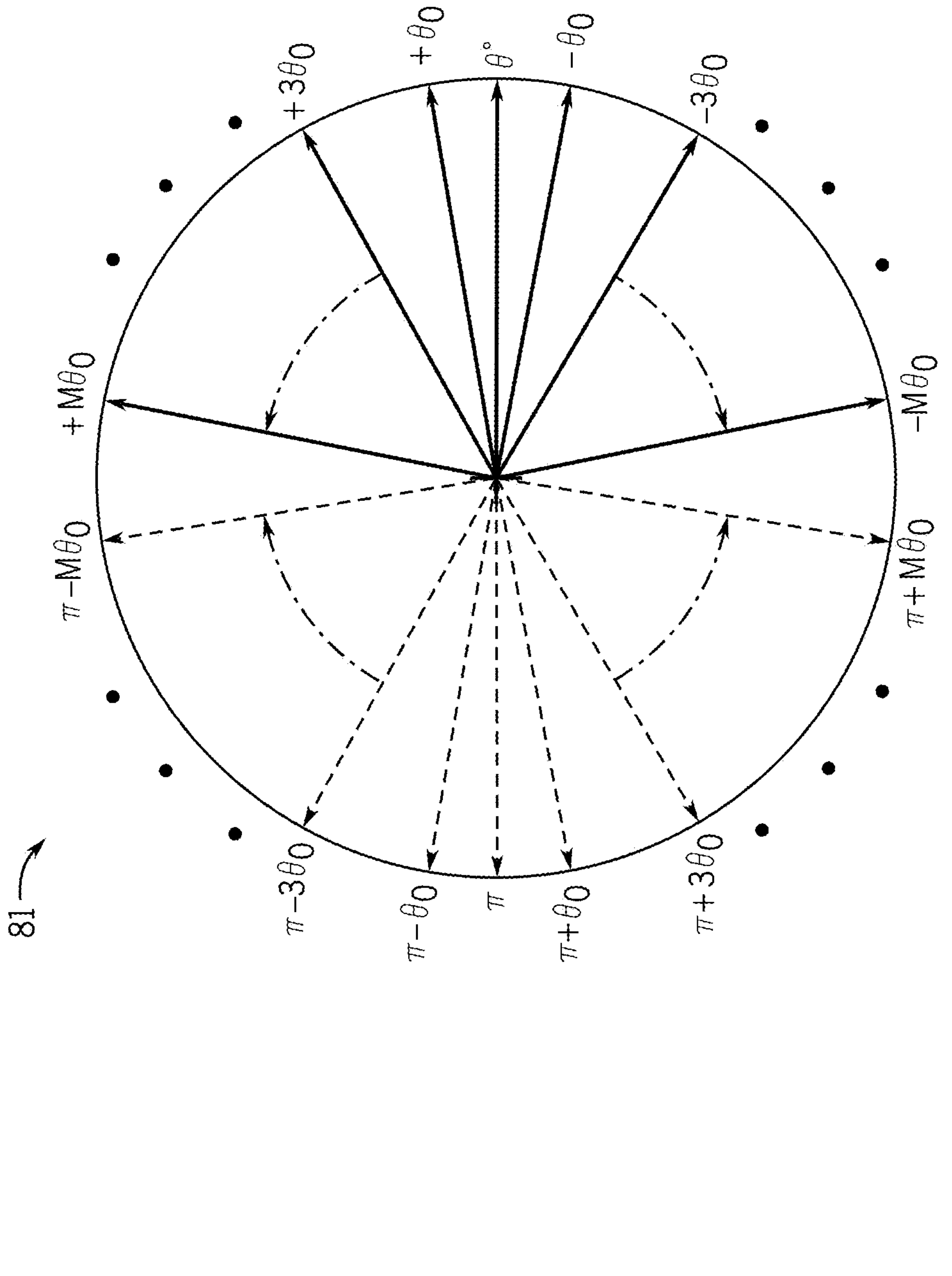
FIG. 5 is a graph illustrating phase shift values of a phase shifter circuit of a receiver and/or the transmitter of FIGS. 3 and 4, according to embodiments of the present disclosure.

FIG. 5 is a graph 81 illustrating phase shift values of the phase shifter circuit 68 including the inverter block 72 and the multiple cascaded phase shifter cells 71, according to embodiments of the present disclosure. For example, the phase shifter circuit 68 may correspond to or include either of, one or more of, or all of the phase shifter circuits 68-1, 68-2, 68-3, and/or 68-N discussed above. Moreover, the inverter block 72 may correspond to or include either of, one or more of, or all of the inverter blocks 72-1, 72-2, 72-3, and/or 72-N. Furthermore, the multiple cascaded phase shifter cells 71 may correspond to or include either of, one or more of, or all of the multiple cascaded phase shifter cells 71-1, 71-2, 71-3, and/or 71-N.

As mentioned above, the phase shifter circuit 68 may include any viable number of phase shifter cells (e.g., M). The inverter block 72 may shift the phase of the first amplified signal 67 by 0° or 180° (e.g., π) phase based on a control signal (e.g., $C_{N0}$). The phase shifter cells 71 may each shift the phase of the amplified signal 67 by a positive fractional phase shift value (+0°, +1°, +3°, +10°, +22.5°, +45°, among other possibilities) or a negative fractional phase shift value ($-\theta_0$, −1°, −3°, −10°, −22.5°, −45°, among other possibilities) based on a respective control signal (e.g., $C_{N1}$, $C_{N2}$, or $C_{NM}$). Moreover, as discussed above, the phase shift values of the inverter block 72 and each of the respective cascaded phase shifter cells 71 may cumulatively combine.

In some embodiments, the phase shifter circuit 68 may include an even number of phase shifter cells 71 (e.g., 2, 4, 6, 8, M). In some cases, the phase shifter circuit 568 may include the inverter block 72 receiving a control signal (e.g., $C_{10}$) to provide a 0° phase shift. For example, in specific embodiments, the inverter block 72 be removed or omitted from the phase shifter circuit 68. In any case, by the way of example, half of the phase shifter cells 71 may shift the phase of the amplified signal 67 by a positive fractional phase shift value ($+\theta_0$) and the remainder half of the phase shifter cells 71 may shift the phase of the amplified signal 67 by a negative fractional phase shift value ($-\theta_0$). As such, the phase shifter circuit 68 may adjust the phase of the amplified signal 67 by 0° (or near 0°) phase shift value for generating a desired beam.

In alternative cases, the inverter block 72 may receive a control signal (e.g., $C_{10}$) to provide a 180° or π (or near 180° or π) phase shift. For example, half of the phase shifter cells 71 may shift the phase of the amplified signal 67 by a positive fractional phase shift value ($+\theta_0$) and the remainder half of the phase shifter cells 71 may shift the phase of the amplified signal 67 by a negative fractional phase shift value ($-\theta_0$). As such, the phase shifter circuit 68 may adjust the phase of the amplified signal 67 by 180° or π (or near 180° or π) phase shift value for generating a desired beam.

In some cases, the inverter block 72 may receive a control signal (e.g., $C_{10}$) to provide a 0° phase shift when the phase shifter circuit 68 may include an even or odd number of phase shifter cells 71 (e.g., 2, 3, 4, 5, 6, 7, 8, M). For example, in specific embodiments, the inverter block 72 be removed or omitted from the phase shifter circuit 68. In any case, a different number of the phase shifter cells 71 may shift the phase of the amplified signal 67 by a positive fractional phase shift value ($+\theta_0$) compared to shifting the phase of the amplified signal 67 by a negative fractional phase shift value ($-\theta_0$). As such, the phase shifter circuit 68 may adjust the phase of the amplified signal 67 by a different phase shift value (e.g., $-M\theta_0$, $-3\theta_0$, $-2\theta_0$, $-\theta_0$, $+\theta_0$, $+2\theta_0$, $+3\theta_0$, or $+M\theta_0$, among other possibilities) for generating the desired beam.

In alternative or additional cases, the inverter block 72 may receive a control signal (e.g., $C_{10}$) to provide a 180° or π (or near 180° or π) phase shift when the phase shifter circuit 68 may include an even or odd number of phase shifter cells 71 (e.g., 2, 3, 4, 5, 6, 7, 8, M). Moreover, a different number of the phase shifter cells 71 may shift the phase of the amplified signal 67 by a positive fractional phase shift value ($+\theta_0$) compared to shifting the phase of the amplified signal 67 by a negative fractional phase shift value ($-\theta_0$). As such, the phase shifter circuit 68 may adjust the phase of the amplified signal 67 by a different phase shift value (e.g., $\pi+M\theta_0$, $\pi+3\theta_0$, $\pi+2\theta_0$, $\pi+\theta_0$, $\pi-\theta_0$, $\pi-2\theta_0$, $\pi-3\theta_0$, or $\pi-M\theta_0$, among other possibilities) for generating the desired beam. It should be appreciated that in specific embodiments, one or more of the phase shifter cells 71 may be bypassed, for example, based on a control signal (e.g., $C_{N1}$, $C_{N2}$, or $C_{NM}$).

Figure 6:
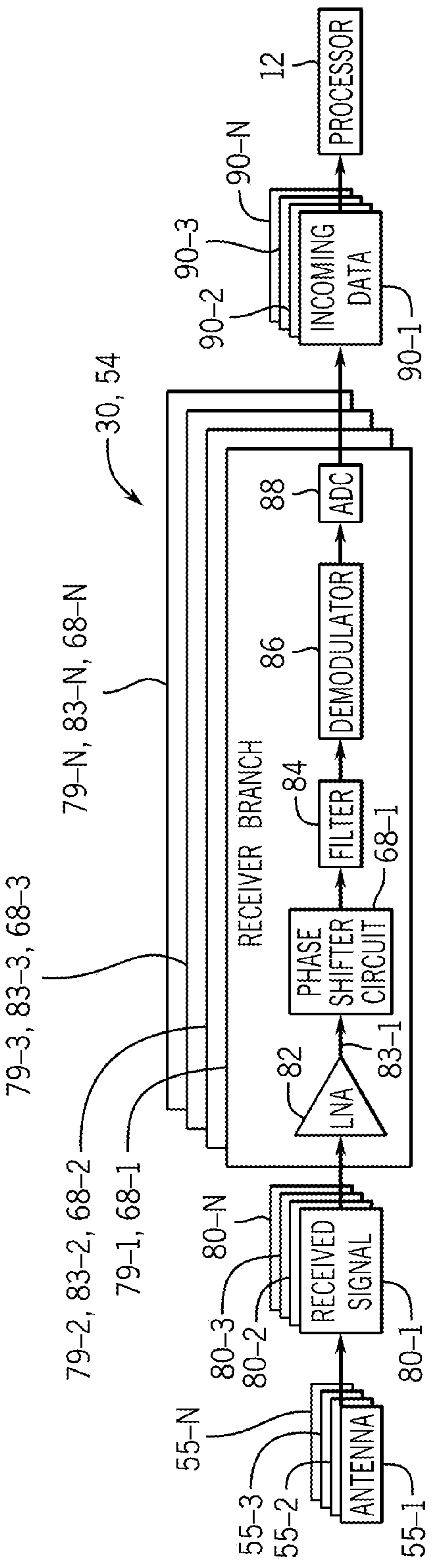
FIG. 6 is a schematic diagram of a receiver of the electronic device of FIG. 1 including the phase shifter circuits, according to embodiments of the present disclosure.

FIG. 6 is a schematic diagram of the receiver 54 (e.g., receive circuitry) including the first receiver branch 79-1, the second receiver branch 79-2, the third receiver branch 79-3, and the fourth receiver branch 79-N, according to embodiments of the present disclosure. In different embodiments, the receiver 54 may include a different number of receiver branches 79. As illustrated, the receiver 54 may receive received signals 80-1, 80-2, 80-3, and 80-N (e.g., received analog signals) from the antennas 55-1, 55-2, 55-3, and 55-N in the form of an analog signal from a desired beam (e.g., a signal reception beam). For example, the first receiver branch 79-1 may receive first received signal 80-1 from the first antenna 55-1, the second receiver branch 79-2 may receive second received signal 80-2 from the second antenna 55-2, the third receiver branch 79-3 may receive third received signal 80-3 from the third antenna 55-3, and the fourth receiver branch 79-N may receive fourth received signal 80-N from the fourth antenna 55-N.

The receiver branches 79-1, 79-2, 79-3, and 79-N may each output a respective incoming data 90-1, 90-2, 90-3, and 90-N based on receiving the received signals 80-1, 80-2, 80-3, and 80-N. The first receiver branch 79-1 is described below. It should be appreciated that in some embodiments, the receiver branches 79-2, 79-3, and/or 79-N may include similar circuitry. Alternatively or additionally, the receiver branches 79-2, 79-3, and/or 79-N may include different circuitry.

In the depicted embodiment, a low noise amplifier (LNA) 82 may input the received signal 80-1. The low noise amplifier 82 may generate a first amplified signal 83-1 by amplifying the received signal 80-1 to a suitable level for the receiver 54 to process. The first phase shifter circuit 68-1 may adjust a phase of the first amplified signal 83-1 based on the desired beam. It should be appreciated that in different cases, the first phase shifter circuit 68-1 may adjust the phase of the first amplified signal 83-1 by a different phase shift value. For example, the processor 12 of the electronic device 10 discussed above may generate control signals to adjust the phase shift value of the first phase shifter circuit 68-1 based on the desired beam. Moreover, the receiver branches 79-2, 79-3, and/or 79-N may each include respective phase shifter circuits 68-2, 68-3, and 68-N to adjust a phase of respective amplified signals 83-2, 83-3, and 83-N (discussed below) based on the desired beam, as will be appreciated. In different cases, each of the phase shifter circuits 68-1, 68-2, 68-3, and 68-N may adjust a phase of the respective amplified signals 83-2, 83-3, and 83-N by a similar phase shift value or different phase shift values based a direction for receiving desired beam associated with the respective antennas 55-1, 55-2, 55-3, and 55-N.

A filter 84 (e.g., filter circuitry and/or software) may remove undesired noise from the first amplified signal 83-1 (e.g., the phase-shifted first amplified signal 83-1), such as cross-channel interference. The filter 84 may also remove additional signals received by the first antenna 55-1 that are at frequencies other than the desired signal. The filter 84 may include any suitable filter or filters to remove the undesired noise or signals from the first amplified signal 83-1, such as a bandpass filter, a bandstop filter, a low pass filter, a high pass filter, and/or a decimation filter. The low noise amplifier 82, the phase shifter circuit 68-1, and/or the filter 84 may be referred to as part of the RFFE, and more specifically, a receiver front end (RXFE) of the electronic device 10.

A demodulator 86 may remove a radio frequency carrier signal and/or extract a demodulated signal (e.g., an envelope signal) from the first amplified signal 83-1 (e.g., the filtered and/or phase-shifted first amplified signal 83-1) for processing. An analog-to-digital converter (ADC) 88 may receive the demodulated analog signal and convert the signal to a digital signal of first incoming data 90-1 to be further processed by the electronic device 10. Additionally, the first receiver branch 79-1 may include any suitable additional components not shown, or may not include certain of the illustrated components, such that the receiver 54 may receive the received signal 80 via the one or more antennas 55-1, 55-2, 55-3, and/or 55-N. For example, the first receiver branch 79-1 may include a mixer and/or a digital down converter.

As mentioned above, the receiver branches 79-1, 79-2, 79-3, and 79-N may each generate and output the respective incoming data 90-1, 90-2, 90-3, and 90-N. As mentioned above, the receiver branches 79-2, 79-3, and 79-N may each include similar or different circuitry compared to the receiver branch 79-1 shown in FIG. 6. In any case, the receiver branches 79-1, 79-2, 79-3, and 79-N may output the respective incoming data 90-1, 90-2, 90-3, or 90-N to the processor 12 discussed above. It should be appreciated that in alternative or additional embodiments, the receiver 54 may output the incoming data 90-1, 90-2, 90-3, and 90-N to any other viable component.

Figure 7:
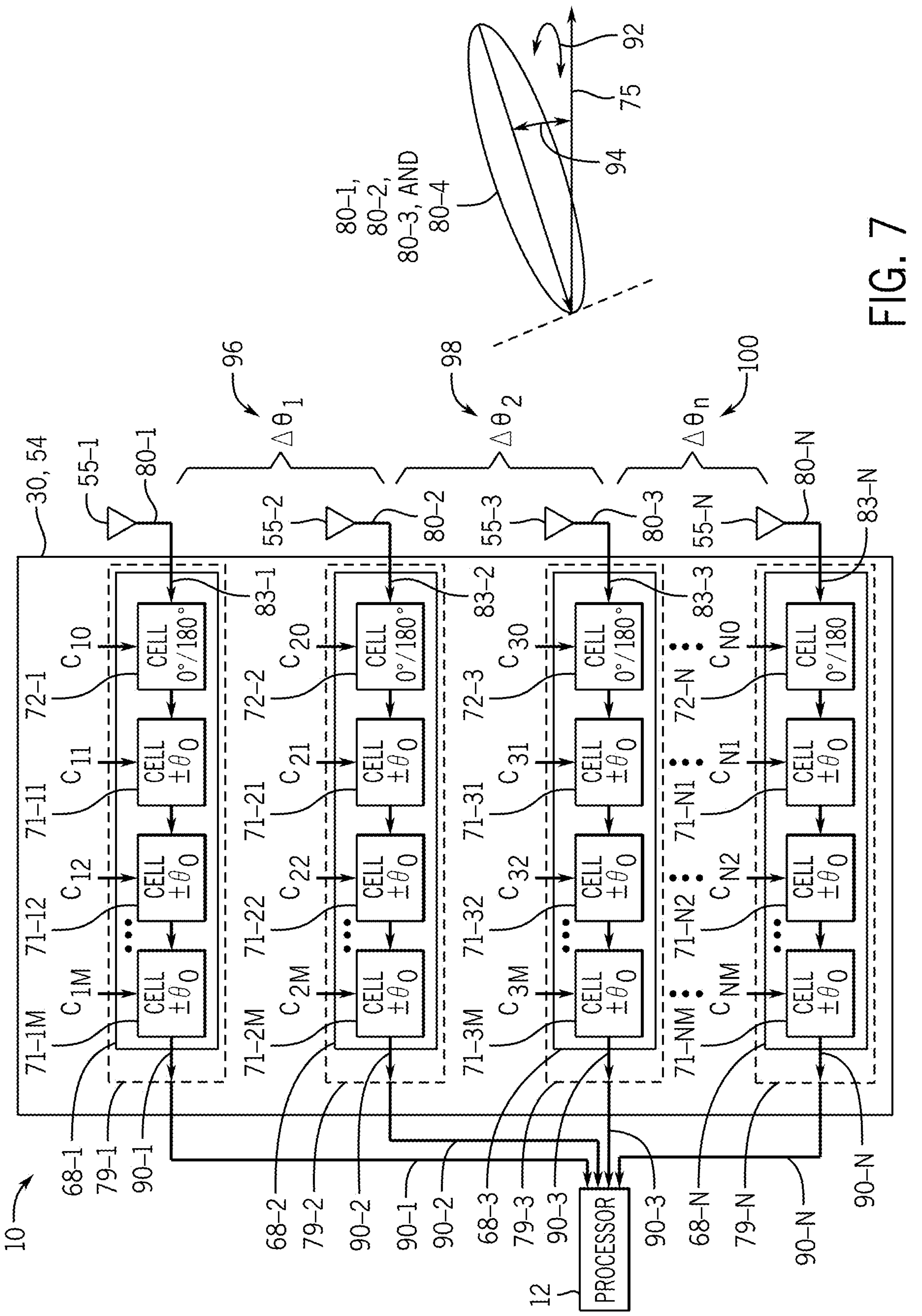
FIG. 7 is a schematic diagram of the phase shifter circuits of receiver branches of the receiver of FIG. 6 including multiple cascaded phase shifter cells, according to embodiments of the present disclosure.

FIG. 7 is a schematic diagram of the phase shifter circuits 68-1, 68-2, 68-3, and 68-N of the receiver branches 79-1, 79-2, 79-3, and 79-N including the cascaded phase shifter cells 71, according to embodiments of the present disclosure. The receiver 54 may include the receiver branches 79-1, 79-2, 79-3, and 79-N each including the respective phase shifter circuit 68-1, 68-2, 68-3, or 68-N. In particular, the first receiver branch 79-1 may include the first phase shifter circuit 68-1, the second receiver branch 79-2 may include a second phase shifter circuit 68-2, the third receiver branch 79-3 may include a third phase shifter circuit 68-3, and the fourth receiver branch 79-N may include a fourth phase shifter circuit 68-N.

Although four receiver branches 79-1, 79-2, 79-3, and 79-N are depicted and described herein, it should be appreciated that the receiver 54 may include any viable number of receiver branches 79 (e.g., two, three, five, twenty one, among other possibilities). Similarly, although four phase shifter circuits 68-1, 68-2, 68-3, and 68-N are depicted and described herein, it should be appreciated that the receiver 54 may include any viable number of the phase shifter circuits 68 (e.g., two, three, five, nine, among other possibilities). Moreover, in the depicted embodiment, the phase shifter circuits 68-1, 68-2, 68-3, and 68-N may each include the respective inverter block 72. It should be appreciated that in alternative or additional embodiments, one or more of the phase shifter circuits 68-1, 68-2, 68-3, and 68-N may omit or bypass the respective inverter block 72. Furthermore, it should be appreciated that FIG. 4 depicts a portion of the electronic device 10 for illustration and simplicity. For example, the processor 12 may be coupled to the phase shifter circuits 68-1, 68-2, 68-3, and 68-N via the low noise amplifier 82, the filter 84, the demodulator 86, the analog-to-digital converter 88, among other things. Similarly, in different embodiments, the phase shifter circuits 68-1, 68-2, 68-3, and 68-N may be coupled to the antennas 55-1, 55-2, 55-3, and 55-N via the analog-to-digital converter 88, the demodulator 86, the filter 84, and/or the low noise amplifier 82, among other things.

The first phase shifter circuit 68-1 may include the first inverter block 72-1, the first phase shifter cell 71-11, the second phase shifter cell 71-12, and the third phase shifter cell 71-1M. The second phase shifter circuit 68-2 may include the second inverter block 72-2, the first phase shifter cell 71-21, the second phase shifter cell 71-22, and the third phase shifter cell 71-2M. The third phase shifter circuit 68-3 may include the third inverter block 72-3, the first phase shifter cell 71-31, the second phase shifter cell 71-32, and the third phase shifter cell 71-3M. Moreover, the fourth phase shifter circuit 68-N may include the fourth inverter block 72-N, the first phase shifter cell 71-N1, the second phase shifter cell 71-N2, and the third phase shifter cell 71-NM. Although in the depicted embodiment each of the phase shifter circuits 68-1, 68-2, 68-3, and 68-N include three phase shifter cells 71, it should be appreciated that each of the phase shifter circuits 68-1, 68-2, 68-3, and 68-N of the receiver 54 may include any other viable number of phase shifter cells (e.g., two, three, seven, M, among other possibilities).

As described above, the low noise amplifier 82, among other things, of the first receiver branch 79-1 may generate the first amplified signal 83-1 based on the received signal 80-1. The receiver branches 79-2, 79-3, and 79-N may generate the amplified signals 83-2, 83-3, and 83-N based on the received signals 80-2, 80-3, and 80-N. As such, the first phase shifter circuit 68-1 may receive the first amplified signal 83-1, the second phase shifter circuit 68-2 may receive a second amplified signal 83-2, the third phase shifter circuit 68-3 may receive a third amplified signal 83-3, and the fourth phase shifter circuit 68-N may receive a fourth amplified signal 83-N.

Each of the antennas 55-1, 55-2, 55-3, 55-3, and 55-N may receive the received signals 80-2, 80-3, and 80-N from a respective direction associated with the desired beam. In some cases, the desired beam may correspond to receiving a directed stream of the received signals 70-1, 70-2, 70-3, and 70-N from an azimuth angle 92 and an elevation angle 94, for example, based on having designated phases with respect to a reference phase, and orthogonal to a respective wave front line. In the depicted embodiment, the reference phase may be associated with receiving the received signals 80-2, 80-3, and 80-N by the antennas 55-1, 55-2, 55-3, and 55-N from the reference direction 75 discussed above. The receiver 54 may adjust a phase associated with receiving each of the received signals 80-1, 80-2, 80-3, and 80-N (and/or the amplified signals 83-1, 83-2, 83-3, and 83-N) such that the incoming data 90-1, 90-2, 90-3, and 90-N may constructively combine and/or correspond to an equal or near equal phase. Accordingly, the processor 12 may receive, combine, and/or process the incoming data 90-1, 90-2, 90-3, and 90-N.

In particular, each of the phase shifter circuits 68-1, 68-2, 68-3, and/or 68-N may adjust a phase of the respective amplified signals 83-1, 83-2, 83-3, and/or 83-N by a respective phase shift value (e.g., −100°, −54°, −23°, −5°, 0°, 3°, 24°, 45°, among other possibilities). The respective phase shift values may correspond to a direction for receiving the respective received signals 80-1, 80-2, 80-3, and 80-N. As mentioned above, the direction for receiving each of the received signals 80-1, 80-2, 80-3, and 80-N is based on the desired beam.

For example, the first antenna 55-1 may receive the received signal 80-1 with a first phase difference (e.g., $\Delta\ \theta_1$, first differential reception phase) 96 compared to the second antenna 55-2 receiving the received signal 80-2. Moreover, the second antenna 55-2 may receive the received signal 80-2 with a second phase difference (e.g., $\Delta\ \theta_2$, second differential reception phase) 98 compared to the third antenna 55-3 receiving the received signal 80-3. Furthermore, the third antenna 55-3 may receive the received signal 80-3 with a third phase difference (e.g., $\Delta\ \theta_3$, third differential reception phase) 100 compared to the fourth antenna 55-N receiving the received signal 80-N.

In some cases, one or more of the phase shifter circuits 68-1, 68-2, 68-3, and/or 68-N may adjust the phase of the respective amplified signals 83-1, 83-2, 83-3, and/or 83-N by different phase shift values to generate the incoming data 90-1, 90-2, 90-3, and 90-N with an equal or near equal phase. The one or more phase shifter circuits 68-1, 68-2, 68-3, and/or 68-N may adjust the phase of the respective amplified signals 83-1, 83-2, 83-3, and/or 83-N by different phase shift values compared to one or more other phase shifter circuits 68-1, 68-2, 68-3, and/or 68-N. As such, in some embodiments, the processor 12 may receive, combine, and/or process the incoming data 90-1, 90-2, 90-3, and 90-N based on the incoming data 90-1, 90-2, 90-3, and 90-N having the equal or near equal phase.

With the foregoing in mind, each of the inverter blocks 72 and the phase shifter cells 71 of the phase shifter circuits 68-1, 68-2, 68-3, and/or 68-N may be programmable. As discussed above, each of the inverter blocks 72 and the phase shifter cells 71 may shift the phase of the signal by a positive phase shift value, zero or near zero phase shift value, and/or a negative phase shift value based on receiving a respective control signal. In some cases, the processor 12 may generate the control signals.

For example, the processor 12 may generate a first set of control signals ($C_{10}$, $C_{11}$, $C_{12}$, and $C_{1M}$) for the first inverter block 72-1 and the phase shifter cells 71-1 of the first phase shifter circuit 68-1. The first phase shifter circuit 68-1 may adjust a phase of the first amplified signal 83-1 by a first phase shift value. The inverter block 72 may shift the phase of the first amplified signal 83-1 by 0° or 180° (e.g., It) phase based on a control signal (e.g., $C_{10}$). The phase shifter cells 71-1 may each shift the phase of the first amplified signal 83-1 by a positive fractional phase shift value ($+\theta_0$) or a negative fractional phase shift value ($-\theta_0$) based on a respective control signal (e.g., $C_{11}$, $C_{12}$, or $C_{1M}$). In some cases, the positive fractional phase shift value and the negative fractional phase shift value may have an equal or nearly equal absolute value.

In the depicted embodiment, the first inverter block 72-1 and the phase shifter cells 71-1 may be coupled to each other in a cascaded form. As such, the phase shift values of the first inverter block 72-1 and each of the cascaded phase shifter cells 71-1 may cumulatively combine. Moreover, a combination of the phase shift values of the first inverter block 72-1 and each of the cascaded phase shifter cells 71-1 may correspond to the first phase shift value of the first phase shifter circuit 68-1. Accordingly, the first receiver branch 79-1 and/or the first phase shifter circuit 68-1 may output the first incoming data 90-1 with an adjusted phase corresponding to the reference phase discussed above based on the first phase shift value.

Similarly, the processor 12 may generate a second set of control signals ($C_{20}$, $C_{21}$, $C_{22}$, and $C_{2M}$) for the second inverter block 72-2 and the phase shifter cells 71-2 of the second phase shifter circuit 68-2. Moreover, the processor 12 may generate a third set of control signals ($C_{30}$, $C_{31}$, $C_{32}$, and $C_{3M}$) for the third inverter block 72-3 and the phase shifter cells 71-3 of the third phase shifter circuit 68-3. Furthermore, the processor 12 may generate a fourth set of control signals ($C_{N0}$, $C_{N1}$, $C_{N2}$, and $C_{NM}$) for the fourth inverter block 72-N and the phase shifter cells 71-N of the fourth phase shifter circuit 68-N.

The second phase shifter circuit 68-2 may adjust a phase of the second amplified signal 83-2 by a second phase shift value, the third phase shifter circuit 68-3 may adjust a phase of the third amplified signal 83-3 by a third phase shift value, and the fourth phase shifter circuit 68-N may adjust a phase of the fourth amplified signal 83-N by a fourth phase shift value. The inverter blocks 72-2, 72-3, and 72-N may shift the phase of the respective amplified signals 83-2, 83-3, or 83-N by 0° or 180° (e.g., $\pi$) phase based on a respective control signal (e.g., $C_{20}$, $C_{30}$, and $C_{N0}$). The phase shifter cells 71-2, 71-3, and 71-N may each shift the phase of the respective amplified signals 83-2, 83-3, or 83-N by the positive fractional phase shift value ($+\theta_0$) or the negative fractional phase shift value ($-\theta_0$) based on a respective control signal (e.g., $C_{21}$, $C_{22}$, $C_{2M}$, $C_{31}$, $C_{32}$, $C_{3M}$, $C_{N1}$, $C_{N2}$, and $C_{NM}$).

The phase shift values of the second inverter block 72-2 and each of the cascaded phase shifter cells 71-2 may cumulatively combine. A combination of the phase shift values of each of the second inverter block 72-2 and the cascaded phase shifter cells 71-2 may correspond to the second phase shift value of the second phase shifter circuit 68-2. Accordingly, the second receiver branch 79-2 and/or the second phase shifter circuit 68-2 may output the second incoming data 90-2 with an adjusted phase corresponding to the reference phase discussed above based on a second phase shift value.

The phase shift values of the third inverter block 72-3 and each of the cascaded phase shifter cells 71-3 may cumulatively combine. A combination of the phase shift values of each of the third inverter block 72-3 and the cascaded phase shifter cells 71-3 may correspond to the third phase shift value of the third phase shifter circuit 68-3. Accordingly, the third receiver branch 79-3 and/or the third phase shifter circuit 68-3 may output the third incoming data 90-3 with an adjusted phase corresponding to the reference phase discussed above based on a third phase shift value.

The phase shift values of the fourth inverter block 72-N and each of the cascaded phase shifter cells 71-N may cumulatively combine. A combination of the phase shift values of each of the fourth inverter block 72-N and the cascaded phase shifter cells 71-N may correspond to the fourth phase shift value of the fourth phase shifter circuit 68-N. Accordingly, the fourth receiver branch 79-N and/or the fourth phase shifter circuit 68-N may output the fourth outgoing data 90-4 with an adjusted phase corresponding to the reference phase discussed above based on a fourth phase shift value.

As such, the processor 12 may receive, combine, and/or process the incoming data 90-1, 90-2, 90-3, and 90-N based on the incoming data 90-1, 90-2, 90-3, and 90-N being associated with the equal or near equal phase. Accordingly, the receiver 54 may receive and process the received signals 80-1, 80-2, 80-3, and 80-N by adjusting respective phases based on the desired beam. As mentioned above, in some cases, the phase shifter cells 71 may each have a smaller insertion loss, phase error, and/or amplitude error compared to that of other phase shifter circuits. Moreover, in some cases, insertion loss, phase errors, and/or amplitude errors of two or more of the cascaded phase shifter cells 71 may at least partially and destructively combine. Accordingly, the phase shifter circuits 68 may each output the signal with a desired phase shift with reduced insertion loss, reduced phase error, and/or reduced amplitude error compared to other phase shifter circuits.

Figure 8:
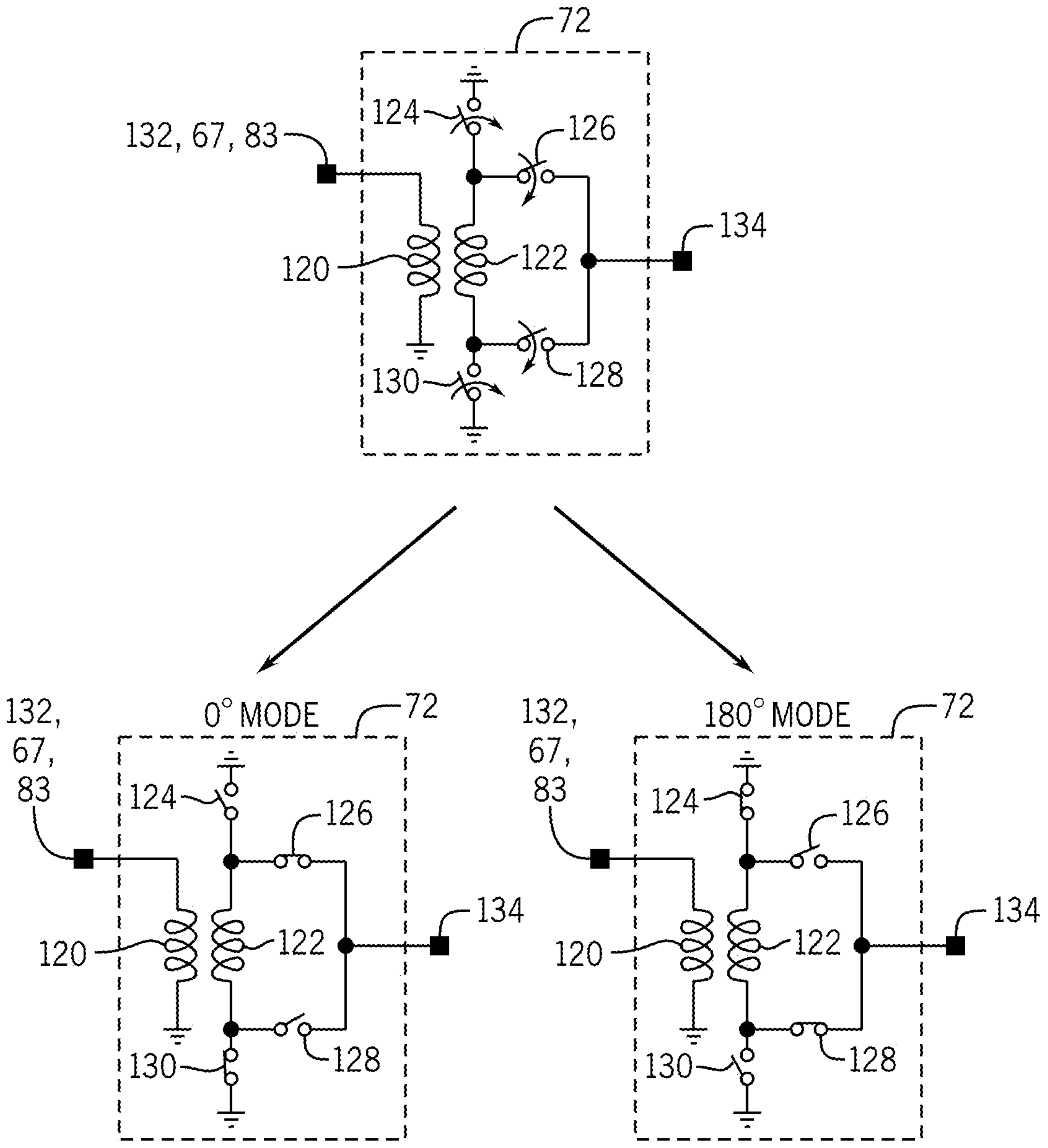
FIG. 8 is a circuit diagram of an implementation of the inverter block of FIGS. 4 and 7, according to embodiments of the present disclosure.

FIG. 8 is a circuit diagram of an implementation of the inverter block 72, according to embodiments of the present disclosure. The inverter block 72 may shift the phase of an input signal by 0° or 180° (e.g., $\pi$) phase based on a control signal (e.g., $C_{10}$, $C_{20}$, $C_{30}$, or $C_{N0}$). For example, the input signal may have an oscillation frequency within a resonant frequency range of the inverter block 72. In the embodiments discussed above, the inverter block 72 may shift the phase of the amplified signal 67 or 83 by 0° or 180° (e.g., $\pi$) phase based on the control signal. The processor 12 discussed above or any other viable circuitry may generate and/or provide the control signal. The control signal may be indicative of a single bit (or digit), two bits, and so on.

The inverter block 72 may include a first inductor 120, a second inductor 122, a first switch 124, a second switch 126, a third switch 128, and a fourth switch 130. The first inductor 120 may be coupled to an input terminal 132 and a ground terminal. The first switch 124 may be coupled to the second inductor 122 and the ground terminal. The second switch 126 may be coupled to the second inductor 122 and an output terminal 134. The third switch 128 may be coupled to the second inductor 122 on one side, and to the second switch 126 and the output terminal 134 on the other side. The fourth switch 130 may be coupled to the second inductor 122 and the third switch 128 on one side, and to the ground terminal on the other side.

By the way of example, the first switch 124 and the third switch 128 may open (or remain opened) and the second switch 126 and the fourth switch 130 may close (or remain closed) in response to a control signal having a first value (e.g., a low value, a logic 0 value, a high value, a logic 1 value). As such, the inverter block 72 may output the input signal without a phase shift (e.g., with a phase shift value of 0° or near 0°). That is, the first inductor 120 and the second inductor 122 may inductively couple to conduct (e.g., inductively conduct) or convey the input signal from the input terminal 132 to the output terminal 134 without a phase shift (e.g., with a phase shift value of 0° or near 0°).

Moreover, the second switch 126 and the fourth switch 130 may open (or remain opened) and the first switch 124 and the third switch 128 may close (or remain closed) in response to a control signal having a second value (e.g., a high value, a logic 1 value, a low value, a logic 0 value). As such, the inverter block 72 may output the input signal with a phase shift value of 180° or near 180° (e.g., $\pi$ or near $\pi$). That is, the first inductor 120 and the second inductor 122 may inductively couple to conduct (e.g., inductively conduct) or convey the input signal from the input terminal 132 to the output terminal 134 with a phase shift value of 180° or near 180° (e.g., $\pi$ or near $\pi$).

Figure 9:
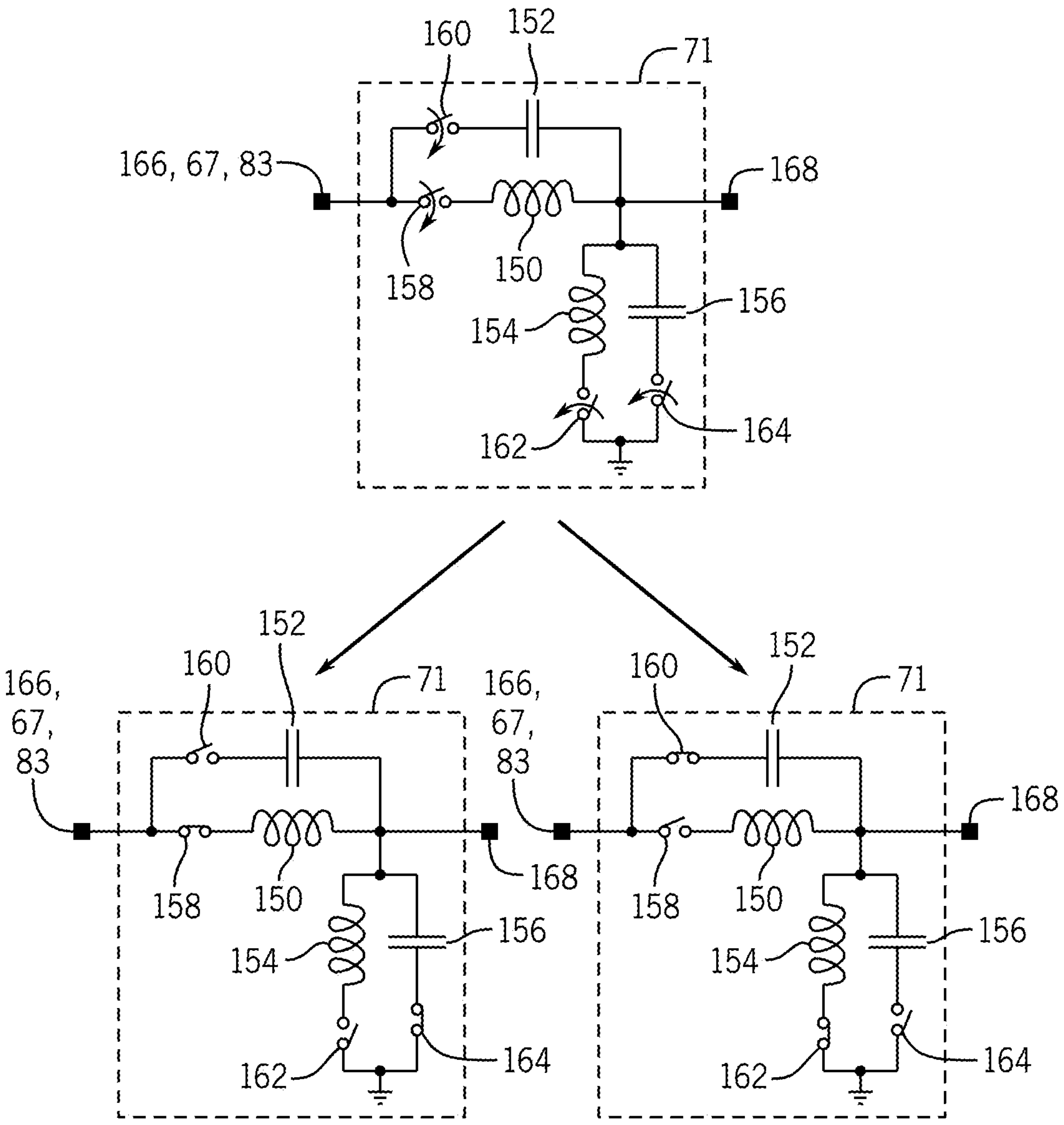
FIG. 9 is a circuit diagram of a first implementation of a phase shifter cell of the multiple cascaded phase shifter cells of FIGS. 4 and 7 including switched parallel inductor and capacitor and switched shunt parallel inductor and capacitor, according to embodiments of the present disclosure.

FIG. 9 is a circuit diagram of a first implementation of the phase shifter cell 71 including switched parallel inductor 150 and capacitor 152 and switched shunt parallel inductor 154 and capacitor 156, according to embodiments of the present disclosure. As mentioned above, the phase shifter cells 71 may each shift the phase of the amplified signal 67 or 83 by a positive fractional phase shift value ($+\theta_0$) or a negative fractional phase shift value ($-\theta_0$). Moreover, the phase shifter cells 71 may each provide the fractional phase shift value based on a respective control signal (e.g., $C_{11}$, $C_{12}$, $C_{1M}$, $C_{21}$, $C_{22}$, $C_{2M}$, $C_{31}$, $C_{32}$, $C_{3M}$, $C_{N1}$, $C_{N2}$, or $C_{NM}$). Furthermore, in some cases, the positive fractional phase shift value and the negative fractional phase shift value may have an equal or nearly equal absolute value.

The phase shifter cell 71 may include a first inductor 150, a first capacitor 152, a second inductor 154, a second capacitor 156, a first switch 158, a second switch 160, a third switch 162, and a fourth switch 164. The first inductor 150 may be coupled to an input terminal 166 via the first switch 158 and may be coupled to an output terminal 168. The first capacitor 152 may be coupled to the input terminal 166 via the second switch 160 and may be coupled to the output terminal 168. The first capacitor 152 may be disposed in parallel to the first inductor 150.

Moreover, the second inductor 154 may be coupled to the first inductor 150, the first capacitor 152, and the output terminal 168 on one side, and may be coupled to the ground terminal via the third switch 162 on the other side. The second capacitor 156 may be coupled to the first inductor 150, the first capacitor 152, and the output terminal 168 on one side, and may be coupled to the ground terminal via the fourth switch 164 on the other side. The second capacitor 156 may be disposed in parallel to the second inductor 154. The first switch 158 may open to bypass the first inductor 150. The second switch 160 may open to bypass the first capacitor 152. The third switch 162 may open to bypass the second inductor 154. The fourth switch 164 may open to bypass the second capacitor 156.

By the way of example, the second switch 160 and the third switch 162 may open (or remain opened) and the first switch 158 and the fourth switch 164 may close (or remain closed) in response to a control signal having a first value (e.g., a low value, a logic 0 value, a high value, a logic 1 value). As such, the phase shifter cell 71 may output the input signal with the negative fractional phase shift value ($-\theta_0$). In particular, the first inductor 150 and the second capacitor 156 may form an inductor-capacitor (LC) circuit that may output the input signal with the negative fractional phase shift value ($-\theta_0$).

Moreover, the first switch 158 and the fourth switch 164 may open (or remain opened) and the second switch 160 and the third switch 162 may close (or remain closed) in response to a control signal having a second value (e.g., a high value, a logic 1 value, a low value, a logic 0 value). As such, the phase shifter cell 71 may output the input signal with the positive fractional phase shift value ($+\theta_0$). In particular, the first capacitor 152 and the second inductor 154 may form a capacitor-inductor (CL) circuit that may output the input signal with the positive fractional phase shift value ($+\theta_0$).

Figure 10:
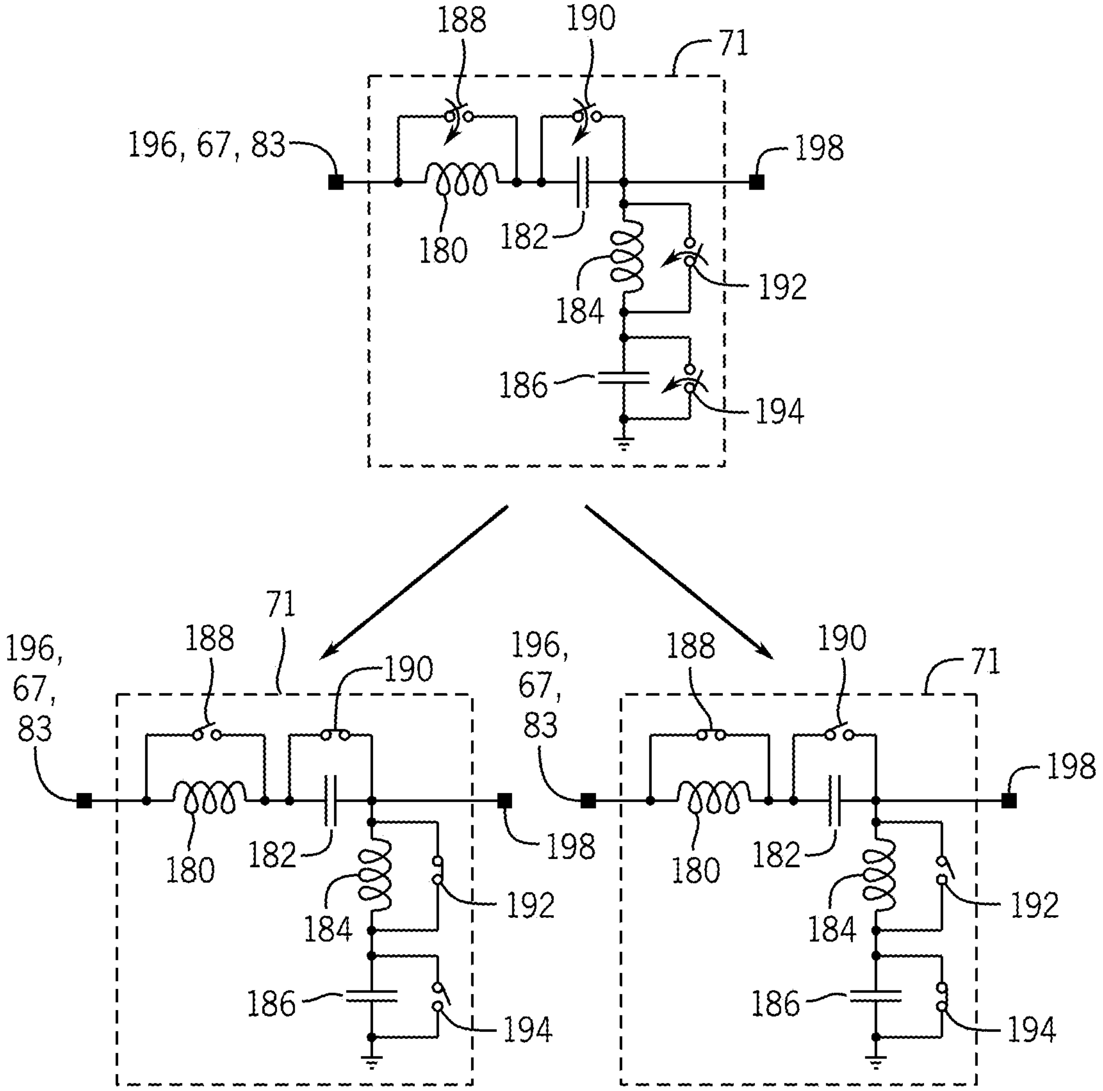
FIG. 10 is a circuit diagram of a second circuit implementation of the phase shifter cell of the multiple cascaded phase shifter cells of FIGS. 4 and 7 including switched series inductor and capacitor and switched shunt series inductor and capacitor, according to embodiments of the present disclosure.

FIG. 10 is a circuit diagram of a second circuit implementation of the phase shifter cells 71 including switched series inductor 180 and capacitor 182 and switched shunt series inductor 184 and capacitor 186, according to embodiments of the present disclosure. As mentioned above, the phase shifter cells 71 may each shift the phase of the amplified signal 67 or 83 by a positive fractional phase shift value ($+\theta_0$) or a negative fractional phase shift value ($-\theta_0$). Moreover, the phase shifter cells 71 may each provide the fractional phase shift value based on a respective control signal (e.g., $C_{11}$, $C_{12}$, $C_{1M}$, $C_{21}$, $C_{22}$, $C_{2M}$, $C_{31}$, $C_{32}$, $C_{3M}$, $C_{N1}$, $C_{N2}$, or $C_{NM}$). Furthermore, in some cases, the positive fractional phase shift value and the negative fractional phase shift value may have an equal or nearly equal absolute value.

The phase shifter cell 71 may include a first inductor 180, a first capacitor 182, a second inductor 184, a second capacitor 186, a first switch 188, a second switch 190, a third switch 192, and a fourth switch 194. The first inductor 180 may be coupled to an input terminal 196 and the first capacitor 182. The first switch 188 may be coupled to the input terminal 196 and the first capacitor 182 in parallel to the first inductor 180. The first capacitor 182 may be coupled to the first inductor 180 and the output terminal 198. The second switch 190 may be coupled to the first inductor 180 and the output terminal 198 in parallel to the first capacitor 182.

Moreover, the second inductor 184 may be coupled to the first capacitor 182 and the output terminal 198 on one side, and to the second capacitor 186 on the other side. The third switch 192 may be coupled to the first capacitor 182 and the output terminal 198 on one side, and to the second capacitor 186 on the other side in parallel to the second inductor 184. The second capacitor 186 may be coupled to the first inductor 180 on one side, and to the ground terminal on the other side. The fourth switch 194 may be coupled to the first inductor 180 on one side, and to the ground terminal on the other side in parallel to the second capacitor 186. The first switch 188 may close to bypass the first inductor 180. The second switch 190 may close to bypass the first capacitor 182. The third switch 192 may close to bypass the second inductor 184. The fourth switch 194 may close to bypass the second capacitor 186.

By the way of example, the first switch 188 and the fourth switch 194 may open (or remain opened) and the second switch 190 and the third switch 192 may close (or remain closed) in response to a control signal having a first value (e.g., a low value, a logic 0 value, a high value, a logic 1 value). As such, the phase shifter cell 71 may output the input signal with the negative fractional phase shift value ($-\theta_0$). In particular, the first inductor 180 and the second capacitor 186 may form an LC circuit that may output the input signal with the negative fractional phase shift value ($-\theta_0$).

Moreover, the second switch 190 and the third switch 192 may open (or remain opened) and the first switch 188 and the fourth switch 194 may close (or remain closed) in response to a control signal having a second value (e.g., a high value, a logic 1 value, a low value, a logic 0 value). As such, the phase shifter cell 71 may output the input signal with the positive fractional phase shift value ($+\theta_0$). In particular, the first capacitor 182 and the second inductor 184 may form a CL circuit that may output the input signal with the positive fractional phase shift value ($+\theta_0$).

Figure 11:
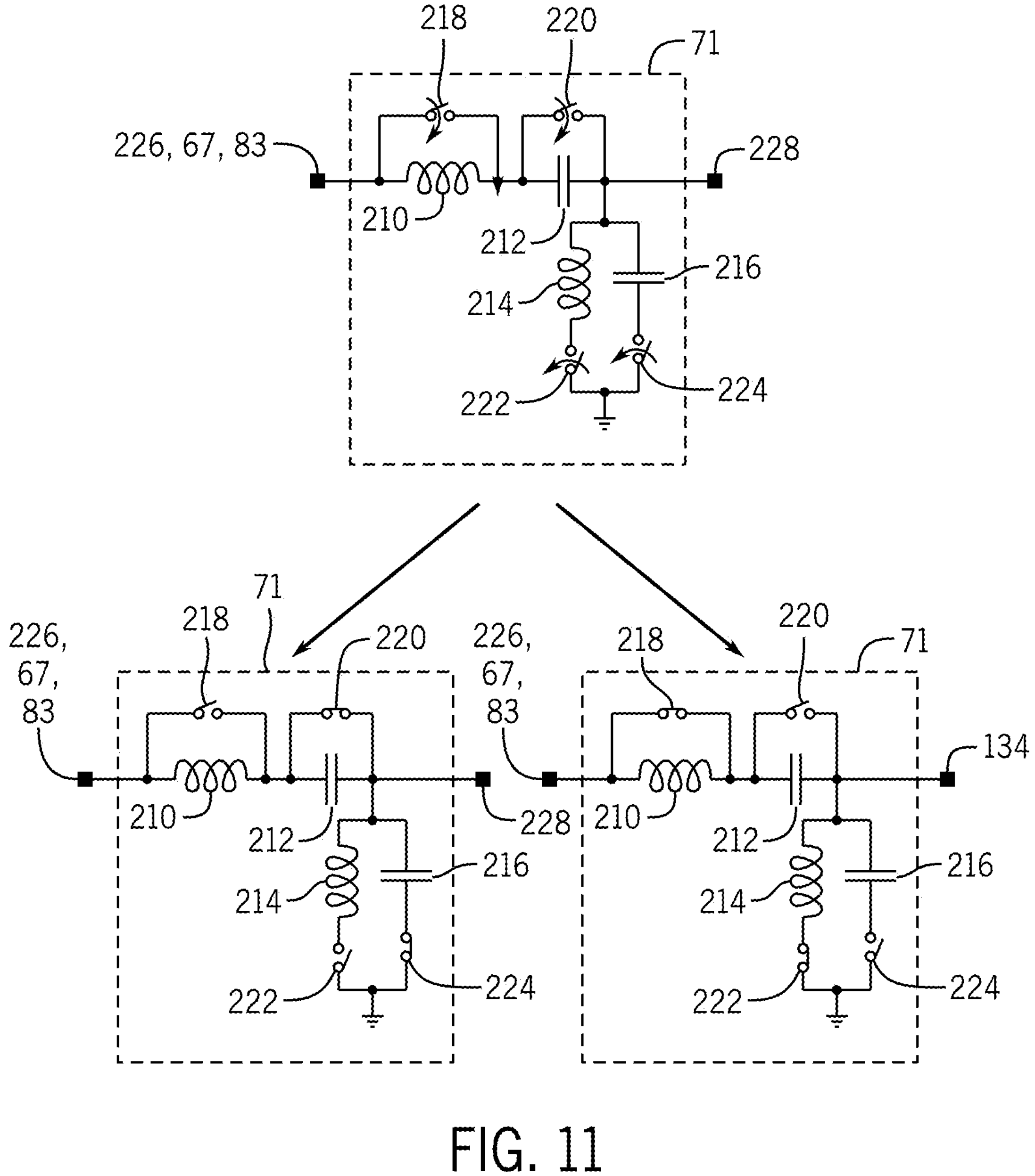
FIG. 11 is a circuit diagram of a third circuit implementation of the phase shifter cell of the multiple cascaded phase shifter cells of FIGS. 4 and 7 including switched series inductor and capacitor and switched shunt parallel inductor and capacitor, according to embodiments of the present disclosure.

FIG. 11 is a circuit diagram of a third circuit implementation of the phase shifter cells 71 including switched series inductor 210 and capacitor 212 and switched shunt parallel inductor 214 and capacitor 216, according to embodiments of the present disclosure. As mentioned above, the phase shifter cells 71 may each shift the phase of the amplified signal 67 or 83 by a positive fractional phase shift value ($+\theta_0$) or a negative fractional phase shift value ($-\theta_0$). Moreover, the phase shifter cells 71 may each provide the fractional phase shift value based on a respective control signal (e.g., $C_{11}$, $C_{12}$, $C_{1M}$, $C_{21}$, $C_{22}$, $C_{2M}$, $C_{31}$, $C_{32}$, $C_{3M}$, $C_{N1}$, $C_{N2}$, or $C_{NM}$). Furthermore, in some cases, the positive fractional phase shift value and the negative fractional phase shift value may have an equal or nearly equal absolute value.

The phase shifter cell 71 may include a first inductor 210, a first capacitor 212, a second inductor 214, a second capacitor 216, a first switch 218, a second switch 220, a third switch 222, and a fourth switch 224. The first inductor 210 may be coupled to an input terminal 226 and the first capacitor 212. The first switch 218 may be coupled to the input terminal 226 and the first capacitor 212 in parallel to the first inductor 210. The first capacitor 212 may be coupled to the first inductor 210 and the output terminal 228. The second switch 220 may be coupled to the first inductor 210 and the output terminal 228 in parallel to the first capacitor 212.

Moreover, the second inductor 214 may be coupled to the first capacitor 212 and the output terminal 228 on one side, and may be coupled to the ground terminal via the third switch 222 on the other side. The second capacitor 216 may be coupled to the first capacitor 212 and the output terminal 228 on one side, and may be coupled to the ground terminal via the fourth switch 224 on the other side. The second capacitor 216 may be disposed in parallel to the second inductor 214. The first switch 218 may close to bypass the first inductor 210. The second switch 220 may close to bypass the first capacitor 212. The third switch 222 may open to bypass the second inductor 214. The fourth switch 224 may open to bypass the second capacitor 216.

By the way of example, the first switch 218 and the third switch 222 may open (or remain opened) and the second switch 220 and the fourth switch 224 may close (or remain closed) in response to a control signal having a first value (e.g., a low value, a logic 0 value, a high value, a logic 1 value). As such, the phase shifter cell 71 may output the input signal with the negative fractional phase shift value ($-\theta_0$). In particular, the first inductor 210 and the second capacitor 216 may form an LC circuit that may output the input signal with the negative fractional phase shift value ($-\theta_0$).

Moreover, the second switch 220 and the fourth switch 224 may open (or remain opened) and the first switch 218 and the third switch 222 may close (or remain closed) in response to a control signal having a second value (e.g., a high value, a logic 1 value, a low value, a logic 0 value). As such, the phase shifter cell 71 may output the input signal with the positive fractional phase shift value ($+\theta_0$). In particular, the first capacitor 212 and the second inductor 214 may form a CL circuit that may output the input signal with the positive fractional phase shift value ($+\theta_0$).

Figure 12:
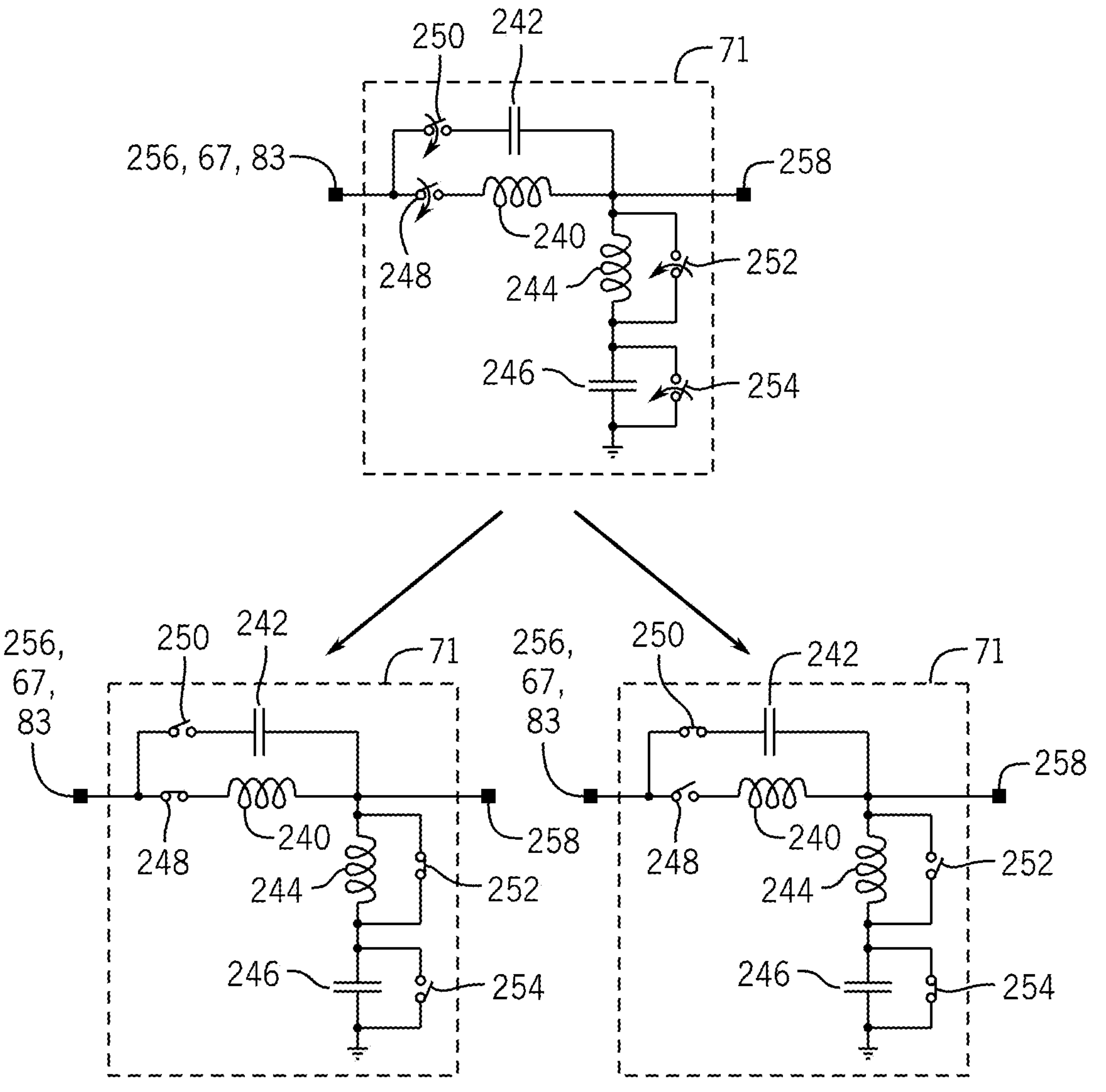
FIG. 12 is a circuit diagram of a fourth circuit implementation the phase shifter cell of the multiple cascaded phase shifter cells of FIGS. 4 and 7 including switched parallel inductor and capacitor and switched shunt series inductor and capacitor, according to embodiments of the present disclosure.

FIG. 12 is a circuit diagram of a fourth circuit implementation of the phase shifter cells 71 including switched parallel inductor 240 and capacitor 242 and switched shunt series inductor 244 and capacitor 246, according to embodiments of the present disclosure. As mentioned above, the phase shifter cells 71 may each shift the phase of the amplified signal 67 or 83 by a positive fractional phase shift value ($+\theta_0$) or a negative fractional phase shift value ($-\theta_0$). Moreover, the phase shifter cells 71 may each provide the fractional phase shift value based on a respective control signal (e.g., $C_{11}$, $C_{12}$, $C_{1M}$, $C_{21}$, $C_{22}$, $C_{2M}$, $C_{31}$, $C_{32}$, $C_{3M}$, $C_{N1}$, $C_{N2}$, or $C_{NM}$). Furthermore, in some cases, the positive fractional phase shift value and the negative fractional phase shift value may have an equal or nearly equal absolute value.

The phase shifter cell 71 may include a first inductor 240, a first capacitor 242, a second inductor 244, a second capacitor 246, a first switch 248, a second switch 250, a third switch 252, and a fourth switch 254. The first inductor 240 may be coupled to an input terminal 256 via the first switch 248 and may be coupled to an output terminal 258. The first capacitor 242 may be coupled to the input terminal 256 via the second switch 250 and may be coupled to the output terminal 258. The first capacitor 242 may be disposed in parallel to the first inductor 240.

Moreover, the second inductor 244 may be coupled to the first inductor 240, the first capacitor 242, and the output terminal 258 on one side, and to the second capacitor 246 on the other side. The third switch 252 may be coupled to the first inductor 240, the first capacitor 242 and the output terminal 258 on one side, and to the second capacitor 246 on the other side in parallel to the second inductor 244. The second capacitor 246 may be coupled to the first inductor 240 on one side, and to the ground terminal on the other side. The fourth switch 254 may be coupled to the first inductor 240 on one side, and to the ground terminal on the other side in parallel to the second capacitor 246. The first switch 248 may open to bypass the first inductor 240. The second switch 250 may open to bypass the first capacitor 242. The third switch 252 may close to bypass the second inductor 244. The fourth switch 254 may close to bypass the second capacitor 246.

By the way of example, the first switch 248 and the fourth switch 254 may open (or remain opened) and the second switch 250 and the third switch 252 may close (or remain closed) in response to a control signal having a first value (e.g., a low value, a logic 0 value, a high value, a logic 1 value). As such, the phase shifter cell 71 may output the input signal with the negative fractional phase shift value ($-\theta_0$). In particular, the first inductor 240 and the second capacitor 246 may form an LC circuit that may output the input signal with the negative fractional phase shift value ($-\theta_0$).

Moreover, the second switch 250 and the third switch 252 may open (or remain opened) and the first switch 248 and the fourth switch 254 may close (or remain closed) in response to a control signal having a second value (e.g., a high value, a logic 1 value, a low value, a logic 0 value). As such, the phase shifter cell 71 may output the input signal with the positive fractional phase shift value ($+\theta_0$). In particular, the first capacitor 242 and the second inductor 244 may form a CL circuit that may output the input signal with the positive fractional phase shift value ($+\theta_0$).

Figure 13:
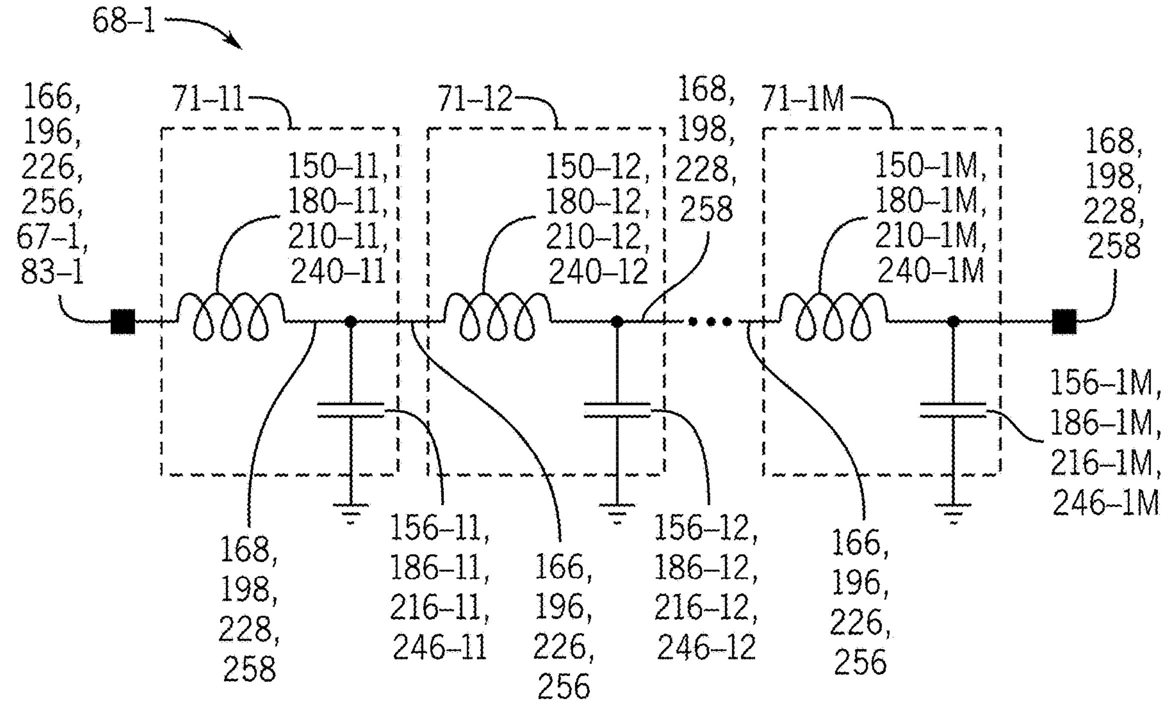
FIG. 13 is a circuit diagram of a distributed inductor-capacitor (LC) implementation of a phase shifter cell of any of the FIGS. 9-12 forming the phase shifter circuit of the transmitter of FIGS. 3 and 4 and/or receiver of FIGS. 5 and 6, according to embodiments of the present disclosure.

FIG. 13 is a circuit diagram of a distributed LC implementation of the phase shifter cells 71 of any of the FIGS. 9-12 forming the phase shifter circuit 68 of the transmitter 52 and/or receiver 54 discussed above, according to embodiments of the present disclosure. By the way of example, FIG. 13 may illustrate the phase shifter cells 71-11, 71-12, and 71-1M forming the phase shifter circuit 68-1 of the transmitter 52 and/or the receiver 54 discussed above. As such, the phase shifter cells 71-11, 71-12, and 71-1M may receive the amplified signals 67 or 83. It should be appreciated that other phase shifter circuits 68 (e.g., phase shifter circuits 68-2, 68-3, and 68-N discussed above) may include the illustrated distributed LC implementation.

The phase shifter cell 71-11 may include the inductor 150-11, 180-11, 210-11, or 240-11 coupled to the respective input terminal 166, 196, 226, or 256. The phase shifter cell 71-11 may include the capacitor 156-11, 186-11, 216-11, or 246-11 (e.g., shunt capacitor) coupled to the respective inductor 150-11, 180-11, 210-11, or 240-11 and the respective output terminal 168, 198, 228, or 258. Similarly, the phase shifter cells 71-12 and 71-1M may include the respective inductors 150-12, 180-12, 210-12, and 240-12 or 150-1M, 180-1M, 210-1M, or 240-1M coupled to the respective input terminal 166, 196, 226, or 256. Moreover, the phase shifter cells 71-12 and 71-1M may include the respective capacitors 156-12, 186-12, 216-12, and 246-12 or 156-1M, 186-1M, 216-1M, or 246-1M (e.g., shunt capacitor) coupled to the respective inductors 150-12, 180-12, 210-12, or 240-12 and 150-1M, 180-1M, 210-1M, or 240-1M and the respective output terminal 168, 198, 228, or 258.

The phase shifter cells 71-11, 71-12, and 71-1M may be coupled in a cascaded form to cumulatively combine the respective fractional phase shift values. That is, the respective output terminal 168, 198, 228, and 258 of the phase shifter cells 71-11 and 71-12 may be coupled to the respective input terminals 166, 196, 226, or 256 of the phase shifter cells 71-12 and 71-1M. In the depicted embodiments, the phase shifter cells 71-11, 71-12, and 71-1M may each form the LC implementation based on receiving control signal (e.g., $C_{11}$, $C_{12}$, or $C_{1M}$) associated with forming the LC implementation. As such, the phase shifter cells 71-11, 71-12, and 71-1M may each shift the phase of the first amplified signal 67-1 or 83-1 by a negative fractional phase shift value ($-\theta_0$). In some cases, each of the phase shifter cells 71-11, 71-12, and 71-1M may have an equal or nearly equal absolute fractional phase shift value.

As discussed above, the phase shift values of each of the respective cascaded phase shifter cells 71 may cumulatively combine. It should be appreciated that although three phase shifter cells 71-11, 71-12, and 71-1M are depicted, in different embodiments, the phase shifter circuit 68-1 may include a different number of phase shifter cells 71. Moreover, it should be appreciated that although the phase shifter cells 71-11, 71-12, and 71-1M form the LC implementation, in different embodiments, one or more of the phase shifter cells 71 may form the CL implementation based on receiving the control signal (e.g., $C_{11}$, $C_{12}$, or $C_{1M}$) associated with forming the CL implementation.

Figure 14:
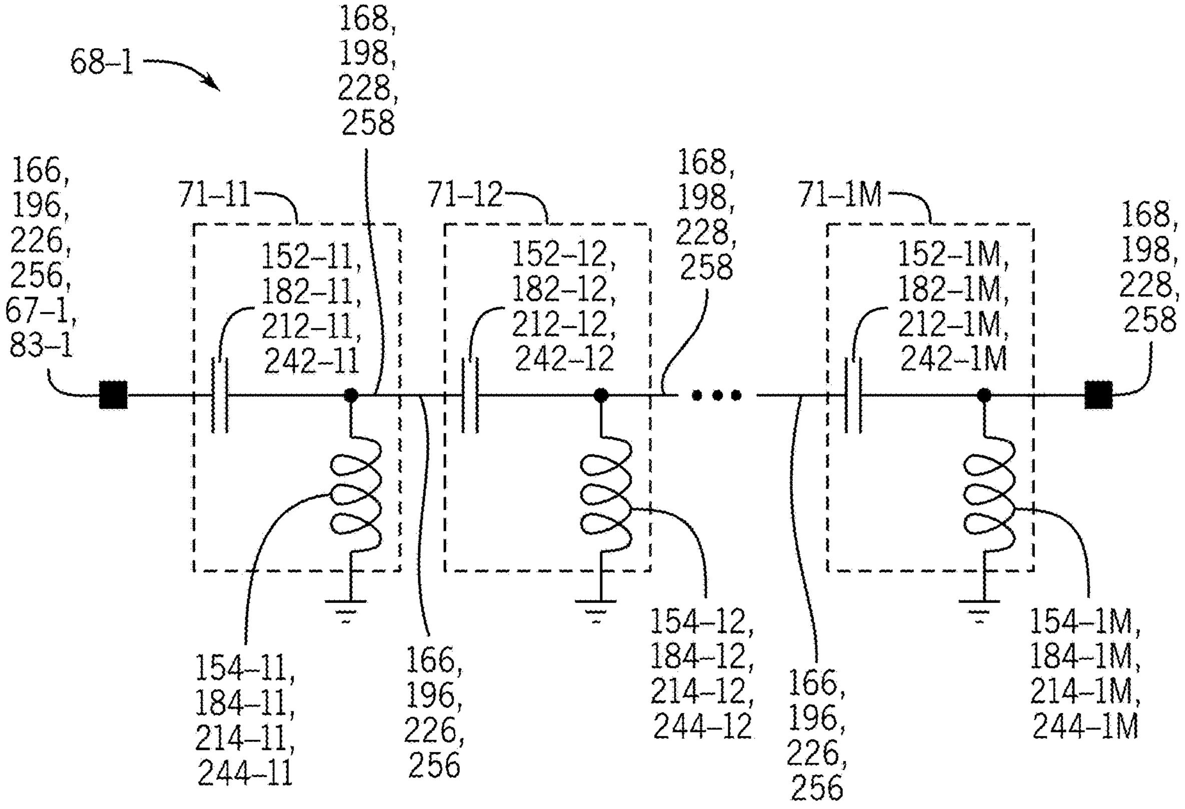
FIG. 14 is a circuit diagram of a distributed capacitor-inductor (CL) implementation of a phase shifter cell of any of the FIGS. 9-12 forming the phase shifter circuit of the transmitter of FIGS. 3 and 4 and/or receiver of FIGS. 5 and 6, according to embodiments of the present disclosure.

FIG. 14 is a circuit diagram of a distributed CL implementation of the phase shifter cells 71 of any of the FIGS. 9-12 forming the phase shifter circuit 68 of the transmitter 52 and/or receiver 54 discussed above, according to embodiments of the present disclosure. By the way of example, FIG. 14 may illustrate the phase shifter cells 71-11, 71-12, and 71-1M forming the phase shifter circuit 68-1 of the transmitter 52 and/or the receiver 54 discussed above. As such, the phase shifter cells 71-11, 71-12, and 71-1M may receive the amplified signals 67 or 83. It should be appreciated that other phase shifter circuits 68 (e.g., phase shifter circuits 68-2, 68-3, and 68-N discussed above) may include the illustrated distributed CL implementation.

The phase shifter cell 71-11 may include the capacitor 152-11, 182-11, 212-11, or 242-11 coupled to the respective input terminal 166, 196, 226, or 256. The phase shifter cell 71-11 may include the inductor 154-11, 184-11, 214-11, or 244-11 (e.g., shunt inductor) coupled to the respective capacitor 152-11, 182-11, 212-11, or 242-11 and the respective output terminal 168, 198, 228, or 258. Similarly, the phase shifter cells 71-12 and 71-1M may include the respective capacitors 152-12, 182-12, 212-12, or 242-12 and 152-1M, 182-1M, 212-1M, or 242-1M coupled to the respective input terminal 166, 196, 226, or 256. Moreover, the phase shifter cells 71-12 and 71-1M may include the respective inductors 154-12, 184-12, 214-12, or 244-12 and 154-1M, 184-1M, 214-1M, or 244-1M (e.g., shunt inductor) coupled to the respective capacitors 152-12, 182-12, 212-12, or 242-12 and 152-1M, 182-1M, 212-1M, or 242-1M and the respective output terminal 168, 198, 228, or 258.

The phase shifter cells 71-11, 71-12, and 71-1M may be coupled in a cascaded form to cumulatively combine the respective fractional phase shift values. That is, the respective output terminal 168, 198, 228, and 258 of the phase shifter cells 71-11 and 71-12 may be coupled to the respective input terminals 166, 196, 226, or 256 of the phase shifter cells 71-12 and 71-1M. In the depicted embodiments, the phase shifter cells 71-11, 71-12, and 71-1M may each form the CL implementation based on receiving control signal (e.g., $C_{11}$, $C_{12}$, or $C_{1M}$) associated with forming the CL implementation. As such, the phase shifter cells 71-11, 71-12, and 71-1M may each shift the phase of the first amplified signal 67-1 or 83-1 by a positive fractional phase shift value ($+\theta_0$). In some cases, each of the phase shifter cells 71-11, 71-12, and 71-1M may have an equal or nearly equal absolute fractional phase shift value.

As discussed above, the phase shift values of each of the respective cascaded phase shifter cells 71 may cumulatively combine. It should be appreciated that although three phase shifter cells 71-11, 71-12, and 71-1M are depicted, in different embodiments, the phase shifter circuit 68-1 may include a different number of phase shifter cells 71. Moreover, it should be appreciated that although the phase shifter cells 71-11, 71-12, and 71-1M form the CL implementation, in different embodiments, one or more of the phase shifter cells 71 may form the LC implementation based on receiving the control signal (e.g., $C_{11}$, $C_{12}$, or $C_{1M}$) associated with forming the LC implementation.

Figure 15:
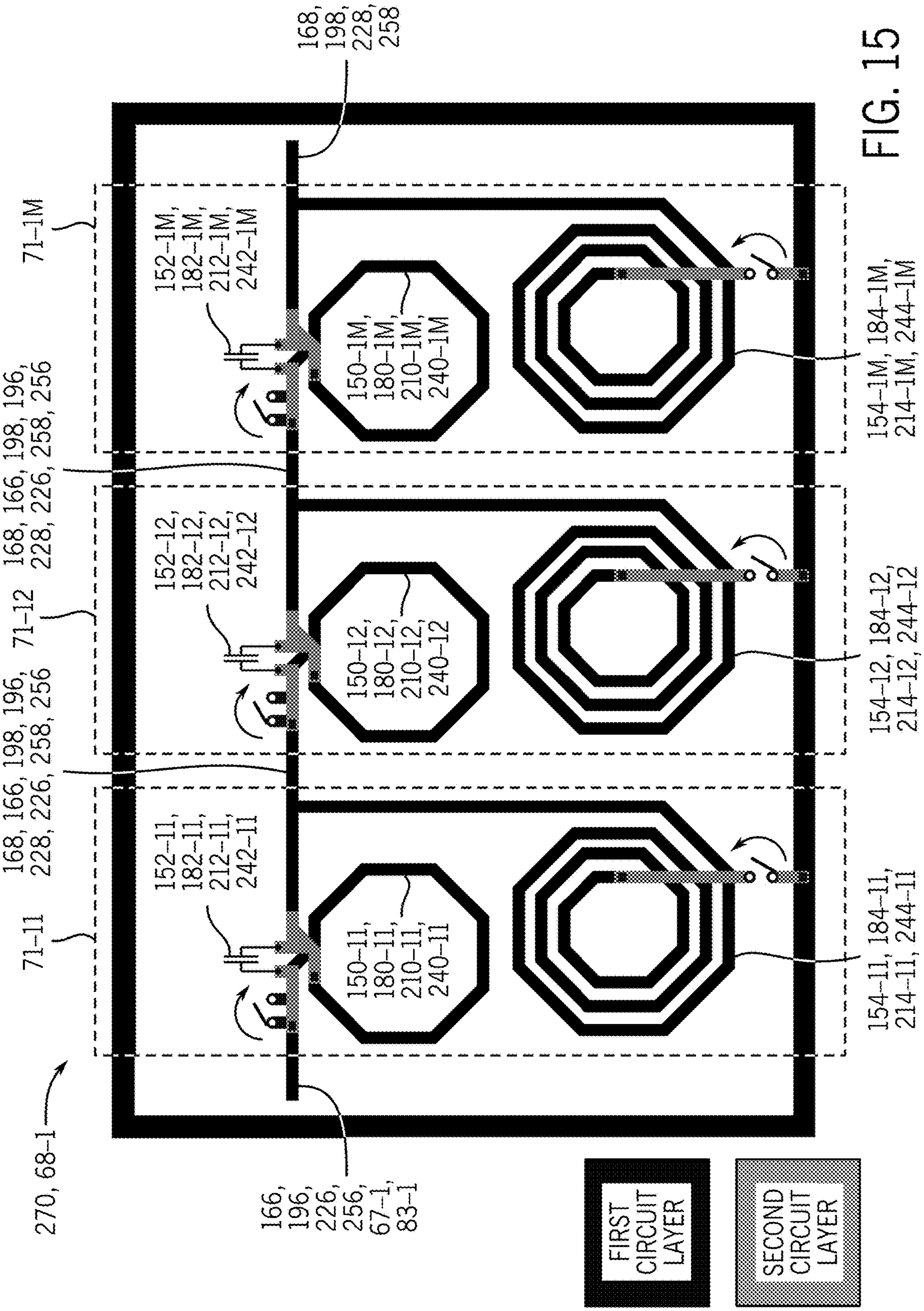
FIG. 15 is a first layout diagram of a phase shifter cell of any of the FIGS. 9-12 forming the phase shifter circuit of the transmitter of FIGS. 3 and 4 and/or receiver of FIGS. 5 and 6 having non-overlapping inductor boundaries, according to embodiments of the present disclosure.

FIG. 15 is a first layout diagram 270 of the phase shifter cells 71 of the phase shifter circuit 68-1 discussed above with respect to FIGS. 4, 7, and 9-14 where the first inductors 150, 180, 210, and 240 and the second inductors 154, 184, 214, and 244 do not have overlapping boundaries, according to embodiments of the present disclosure. In particular, the first layout diagram 270 depicts the first inductors 150, 180, 210, and 240 and the second inductors 154, 184, 214, and 244 implemented with octagonal layers away from each other (e.g., non-overlapping) and may be coupled to a ring guard.

Figure 16:
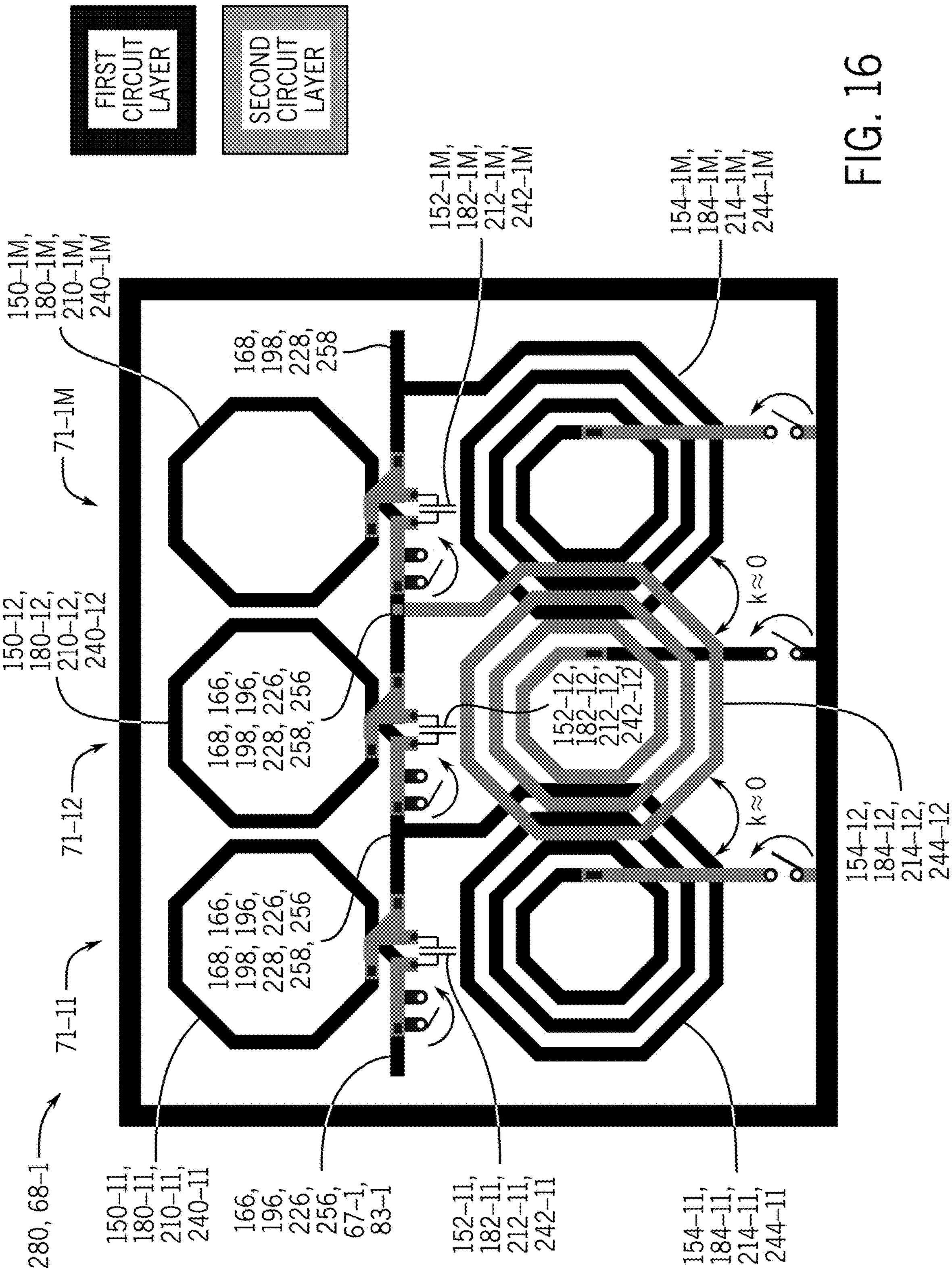
FIG. 16 is a second layout diagram of a phase shifter cell of any of the FIGS. 9-12 forming the phase shifter circuit of the transmitter of FIGS. 3 and 4 and/or receiver of FIGS. 5 and 6 having overlapping boundaries between inductor layouts of different cascaded phase shifter cells, according to embodiments of the present disclosure.

FIG. 16 is a second layout diagram 280 of the phase shifter cells 71 of the phase shifter circuit 68-1 discussed above with respect to FIGS. 4, 7, and 9-14 where the second inductors 154, 184, 214, and 244 have overlapping boundaries, according to embodiments of the present disclosure. In particular, the second layout diagram 280 is associated with the phase shifter circuit 68-1 having overlapping boundaries between inductor layouts of different cascaded phase shifter cells 71.

The second layout diagram 280 depicts the first inductors 150, 180, 210, and 240 and the second inductors 154, 184, 214, and 244 implemented with octagonal layers, where the second inductors 154, 184, 214, and 244 have overlapping boundaries and may be coupled to a ring guard. For example, the first inductors 150, 180, 210, and 240 may be disposed on a first layer and the second inductors 154, 184, 214, 244, 154, 184, 214, and 244 may be disposed on a second layer. In specific embodiments, the first layer and the second layer may correspond to layers of a printed circuit board (PCB), among other possibilities.

Figure 17:
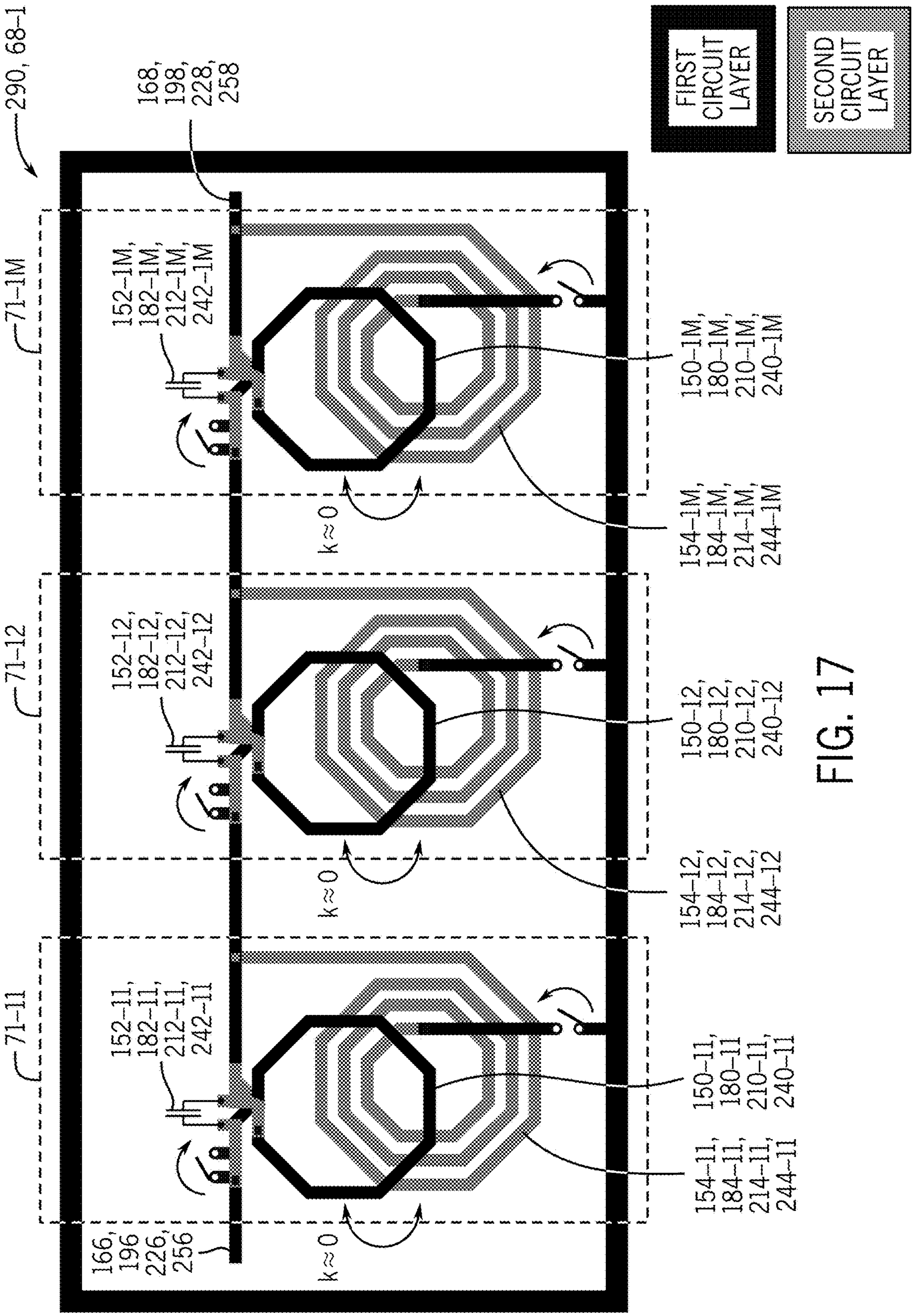
FIG. 17 is a third layout diagram of a phase shifter cell of any of the FIGS. 9-12 forming the phase shifter circuit of the transmitter of FIGS. 3 and 4 and/or receiver of FIGS. 5 and 6 having overlapping boundaries between inductor layouts of a phase shifter cell, according to embodiments of the present disclosure.

FIG. 17 is a third layout diagram 290 of the phase shifter cells 71 of the phase shifter circuit 68-1 discussed above with respect to FIGS. 4, 7, and 9-14 where the first inductors 150, 180, 210, and 240 have overlapping boundaries with the respective second inductors 154, 184, 214, and 244, according to embodiments of the present disclosure. For example, the third layout diagram 290 is associated with the phase shifter circuit 68-1 having overlapping boundaries between inductor layouts of a phase shifter cell 71. The third layout diagram 290 depicts the first inductors 150, 180, 210, and 240 and the second inductors 154, 184, 214, and 244 implemented with octagonal layers and may be coupled to a ring guard.

In the depicted embodiment, the first inductor 150-11, 180-11, 210-11, or 240-11 may have overlapping boundaries with the second inductor 154-11, 184-11, 214-11, or 244-11 (e.g., shunt inductors). The second inductor 150-21, 180-21, 210-21, or 240-21 may have overlapping boundaries with the second inductor 154-12, 184-12, 214-12, or 244-12 (e.g., shunt inductors). Moreover, the first inductor 150-1M, 180-1M, 210-1M, or 240-1M may have overlapping boundaries with the second inductor 154-1M, 184-1M, 214-1M, or 244-1M (e.g., shunt inductors). For example, the first inductors 150, 180, 210, and 240 may be disposed on the first layer and the second inductors 154, 184, 214, 244, 154, 184, 214, and 244 may be disposed on the second layer.

In FIGS. 15-17, the first inductors 150, 180, 210, and 240 may include an octagonal layer and the second inductors 154, 184, 214, and 244 may include intertwined octagonal layers. In different embodiments, the first inductors 150, 180, 210, and 240 and/or the second inductors 154, 184, 214, and 244 may include different numbers of circular layers, rectangular layers, pentagonal layers, hexagonal layers, among other shapes. Moreover, in different embodiments, different portions of the ZZ and/or the ZZ may be overlapped. Furthermore, it should be appreciated that alternative layout diagrams may be envisioned.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A phase shifter circuit comprising:
a first cell comprising
a first inductor in a first series combination with a first switch,
a first capacitor in a second series combination with a second switch, the first series combination coupled in parallel with the second series combination,
a second inductor, and
a second capacitor; and
a second cell coupled to the first cell, the second cell comprising a third inductor, a third capacitor, a fourth inductor, and a fourth capacitor.

2. The phase shifter circuit of claim 1, wherein
the second inductor is in a third series combination with a third switch, and
the second capacitor is in a fourth series combination with a fourth switch, the third series combination coupled in parallel with the fourth series combination.

3. The phase shifter circuit of claim 1, wherein
the first inductor, the first capacitor, or both are coupled to an input terminal and an output terminal of the first cell, and
the second inductor, the second capacitor, or both are coupled to the output terminal and a ground terminal.

4. The phase shifter circuit of claim 1, wherein
the third inductor, the third capacitor, or both are coupled to an input terminal and an output terminal of the second cell, and
the fourth inductor, the fourth capacitor, or both are coupled to the output terminal and a ground terminal.

5. The phase shifter circuit of claim 1, wherein the first cell is configured to shift a phase of a signal by a positive fractional phase shift value and the second cell is configured to shift the phase of the signal by the positive fractional phase shift value.

6. The phase shifter circuit of claim 5, wherein the phase shifter circuit is configured to output the signal with a phase shift value based on the positive fractional phase shift value of the first cell and the positive fractional phase shift value of the second cell.

7. The phase shifter circuit of claim 1, wherein an output terminal of the first cell is coupled to an input terminal of the second cell.

8. The phase shifter circuit of claim 1, comprising a third cell coupled to the second cell, the third cell comprising a fifth inductor, a fifth capacitor, a sixth inductor, and a sixth capacitor.

9. The phase shifter circuit of claim 1, comprising an inverter block configured to invert a signal.

10. An electronic device comprising:
a first phase shifter circuit coupled to a first antenna, the first phase shifter circuit comprising a first cell and a second cell, each of the first cell and the second cell being configured to shift a respective phase of a first signal by a first phase shift value based on a first control signal and shift the respective phase of the first signal by a second phase shift value based on a second control signal; and a second phase shifter circuit coupled to a second antenna, the second phase shifter circuit comprising a third cell and a fourth cell, each of the third cell and the fourth cell being configured to shift a respective phase of a second signal by the first phase shift value based on the first control signal and shift the respective phase of the second signal by the second phase shift value based on the second control signal.

11. The electronic device of claim 10, wherein the first phase shifter circuit is configured to receive the first signal in-phase with the second phase shifter circuit receiving the second signal.

12. The electronic device of claim 10, comprising the first antenna and the second antenna, wherein the first antenna and the second antenna are configured to form a desired beam by outputting the first signal and the second signal.

13. The electronic device of claim 10, wherein the first phase shifter circuit is configured to receive the first signal via the first antenna and the second phase shifter circuit is configured to receive the second signal via the second antenna.

14. The electronic device of claim 13, wherein the first phase shifter circuit is configured to receive the first signal in-phase or out-of-phase compared to the second phase shifter circuit receiving the second signal, the first phase shifter circuit configured to output the first signal in-phase with the second phase shifter circuit outputting the second signal.

15. A transceiver comprising:

a first phase shifter circuit comprising a first cell being coupled to a second cell, the first cell being configured to shift a phase of a signal by a first phase shift value and a second phase shift value, the second cell being configured to shift the phase of the signal by the first phase shift value and the second phase shift value; and a second phase shifter circuit comprising a third cell being coupled to a fourth cell, the third cell being configured to shift the phase of the signal by the first phase shift value and the second phase shift value, and the fourth cell being configured to shift the phase of the signal by the first phase shift value and the second phase shift value.

16. The transceiver of claim 15, wherein the first phase shift value corresponds to a positive fractional phase shift value and the second phase shift value corresponds to a negative fractional phase shift value.

17. The transceiver of claim 16, wherein an absolute value of the first phase shift value corresponds to an absolute value of the second phase shift value.

18. The transceiver of claim 15, wherein the first cell, the second cell, the third cell, and the fourth cell each include circuitry to form an inductor-capacitor circuit to shift the phase of the signal by the first phase shift value based on receiving a first control signal and form a capacitor-inductor circuit to shift the phase of the signal by the second phase shift value based on receiving a second control signal.

19. The transceiver of claim 18, wherein the first phase shifter circuit is configured to couple to a first antenna and the second phase shifter circuit is configured to couple to a second antenna, the first antenna configured to output the signal with the first phase shift value and the second antenna configured to output the signal with the second phase shift value to form a desired beam.

20. The transceiver of claim 18, wherein the first phase shifter circuit is configured to couple to a first antenna and the second phase shifter circuit is configured to couple to a second antenna, the first phase shifter circuit is configured to receive the signal with a first phase via the first antenna and the second phase shifter circuit is configured to receive the signal with a second phase via the second antenna, the first phase shifter circuit is configured to output the signal in-phase with the second phase shifter circuit.

* * * * *